US006808646B1

(12) United States Patent
Jeans

(10) Patent No.: US 6,808,646 B1
(45) Date of Patent: Oct. 26, 2004

(54) METHOD OF REPLICATING A HIGH RESOLUTION THREE-DIMENSIONAL IMPRINT PATTERN ON A COMPLIANT MEDIA OF ARBITRARY SIZE

(75) Inventor: Albert H. Jeans, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 29 days.

(21) Appl. No.: 10/425,891

(22) Filed: Apr. 29, 2003

(51) Int. Cl.$^7$ .......................... C03C 25/68; C03C 15/00; B44C 1/22; C23F 1/00
(52) U.S. Cl. ........................................... 216/54; 216/41
(58) Field of Search .............................. 216/41, 54, 40, 216/47; 430/4, 5, 8, 11, 14, 15, 18, 199, 200, 203, 204, 205, 269, 309, 310, 312–314

(56) References Cited

U.S. PATENT DOCUMENTS

| | | | |
|---|---|---|---|
| 6,180,239 B1 * | 1/2001 | Whitesides et al. ...... | 428/411.1 |
| 6,341,190 B1 | 1/2002 | Summersgill et al. | |
| 6,380,101 B1 * | 4/2002 | Breen et al. ................. | 438/765 |
| 6,517,995 B1 | 2/2003 | Jacobson et al. | |
| 6,656,308 B2 * | 12/2003 | Hougham et al. .......... | 156/247 |
| 6,663,820 B2 * | 12/2003 | Arias et al. ................. | 264/496 |
| 2002/0130444 A1 * | 9/2002 | Hougham .................... | 264/519 |
| 2003/0010241 A1 * | 1/2003 | Fujihira et al. ............. | 101/483 |
| 2003/0104614 A1 * | 6/2003 | Uhrich et al. ................ | 435/325 |
| 2003/0170999 A1 * | 9/2003 | Myerson ...................... | 438/712 |
| 2003/0178316 A1 * | 9/2003 | Jacobs et al. ................ | 205/157 |
| 2004/0040653 A1 * | 3/2004 | Nuzzo et al. ............ | 156/273.3 |

FOREIGN PATENT DOCUMENTS

| | | |
|---|---|---|
| WO | WO96/35971 | 11/1996 |
| WO | WO98/21626 | 5/1998 |
| WO | WO01/11591 | 2/2001 |

OTHER PUBLICATIONS

IBM J. Res. & Dev. vol. 45 No. 5 Sep. 2001; Printing meets lithography: Soft approaches to high–resolution patterning; pp. 697–719.

Scientific American: Soft Manufacturing; Jul. 15, 2002: by Gary Stix; Shaping small structures in rubber has moved beyond a Harvard lab.

Chp. 4: Soft Lithography; George M Whitesides, Department of Chemistry and chemical biology, Harvard University; Scientific Drivers; pp. 1–4; published Jan. 1998.

Replica Molding (REM); Lithotemplate.html; www.ee.washington.edu/research/microtech/cam/camreplicamolding.html.

IBM Zurich Research Laboratory, Science & Technology, Microcontact Processing: High–resolution soft lightorgraphy; www.zurich.ibm.com/st/microcontact/highres.

IBM Zurich Research Laboratory;High–resolution microcontact printig of SAMs; www.zurich.ibm.com/st/.microcontact/highres/mucp.html.

Lithotemplate.html; Micro–contact Printing (uCP): www.ee.washington.edu/research/microtech/carn/cammicrocontactprinting.html.

(List continued on next page.)

Primary Examiner—Gregory Mills
Assistant Examiner—Roberts Culbert
(74) Attorney, Agent, or Firm—Trveman H. Denny, III

(57) ABSTRACT

A method for replicating a high resolution three-dimensional imprint pattern on a compliant media is disclosed. The compliant media carries an imprint stamp that includes three-dimensional features that can be used as an imprint stamp in a roll-to-roll transfer printing process. The compliant media can be made to any size and can be connected with a belt or a cylinder. The compliant media can be optically transparent and the belt or cylinder can be optically transparent so that a light source positioned inside or outside the belt or the cylinder can irradiate another media that is urged into contact with the compliant media.

47 Claims, 16 Drawing Sheets-

OTHER PUBLICATIONS

Letters to nature; Microscopic patterning of orientated mesoscopic silica through guided growth; NatureMacmillan Publisher Ltd 1997; nature/vol390/18/25 Dec. 1997; pp. 674–676.

Surface Modification of Sylgard–184 Poly (dimethyl siloxane) Networkds by Ultraviolet and Ultraviolet/Ozone Treatment; received Mar. 5, 2002; accepted Jul. 11, 2002; Kirill Efimenko, *William E. Wallace, and Jan Genzer; pp. 306–315.

Roller Nanoimprint Lithography; 1998 American Vacuum society; pp. 3926–3928; J. Vac. Sci. Technol. B 16 (6), Nov./Dec. 1998.

Low–Contact–angle Polydimethyl siloxane (PDMS) Membranes in Fabricating Micro–Bioarrays; S.d. gillmore, b.J. : arson, J.M. Braun, C.E. Mason, L.E. Cruz–Barba, Denes, and M.G. Lagally; Now at biology and biomedica Sciences, Yale University.

Low Temperature Bonding for Wafer Scale Packaging and Assembly of Micromachined Sensors; X. Ma, B. Gierhart, S.D. collins and r. L. Smith; department of electrical & computer engineering University of california, Davis, California, 95616; final Report 1998–99 for MICRO Project 98–144 Industrial Sponsor(s): Kumetrix, Inc.

Biomedical Microdevices 3:4, 339–351, 2001:2001 Kluwer Academic Publishers. Manufactured in the Netherlands; design and Fabrication of CD–Like Microfluidic Platforms for Diagnostics: Polymer–Based Microfabrication;.

Development of A Novel Micromachined Magnetostatic Membrane Actuator; Melvin Khoo and Chang Liu; Micro Actuators, Sensors, and Systems (MASS) Group mkhoo@uiuc.edu.

silicone–based Adhesives; Industrial and Electronics Products; www.adhesivesresearch.com/catalog/indsil.htm.

Dow corning; silicon conformal coatings, Encapsulants and Adhesives for electronic applications; www.best–chemical.com/downcorning.htm.

The Yasui Seiki "Micro Gravure" Coating method; Yasui Seiki Co. . : www.yasui.com;p. 1–10.

Teflon AF: A New Generation of High–Performance Fluoropolymer Resins; Copyright 2003 E.E. du Pont de Nemours and company; Dupont Teflon AF.

* cited by examiner

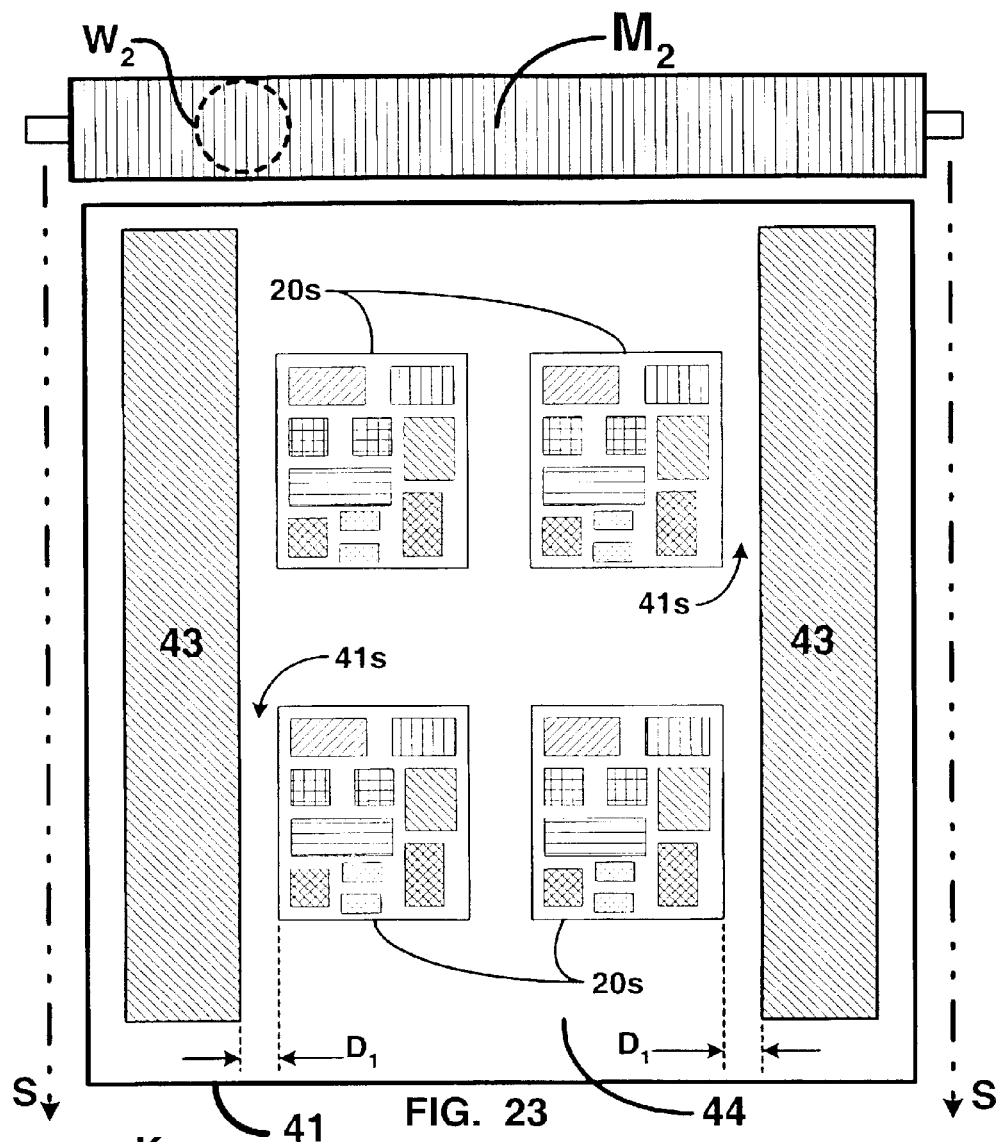
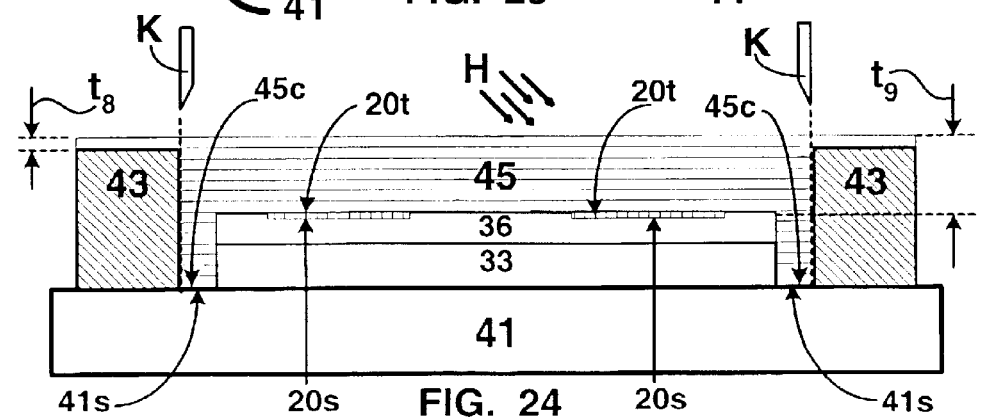

METHOD OF REPLICATING A HIGH RESOLUTION THREE-DIMENSIONAL IMPRINT PATTERN ON A COMPLIANT MEDIA OF ARBITRARY SIZE

FIELD OF THE INVENTION

The present invention relates generally to a method for replicating a three-dimensional imprint pattern on a compliant media of arbitrary size. More specifically, the present invention relates to a method for replicating one or more photopolymer shims that include an imprint stamp on a compliant media that can be used to transfer a high resolution three-dimensional imprint pattern carried on the imprint stamp to another media that is brought into contact with the compliant media in a soft lithography printing process.

BACKGROUND OF THE INVENTION

Large scale shims are often created from smaller masters using a process called recombination. In recombination, a small master stamp is alternately heated and cooled while embossing a thermoplastic substrate. As a result, a pattern in the master stamp is transferred to the thermoplastic substrate. The thermoplastic substrate can then be plated or otherwise coated to create other shims. The machines used for the aforementioned process are expensive (e.g. ≧$90,000) and are not guaranteed to work with patterns that are submicron (i.e. less than 1.0 $\mu$m) in dimension due to a relatively high viscosity of the thermoplastic substrate when in a molten state. Other proprietary processes are available, such as automated holographic systems, for example. However, those proprietary systems are also expensive and the cost per shim can exceed several thousand dollars per shim.

Polydimethyl Siloxane (PDMS), a silicone rubber, is widely recognized as a good material for soft lithography because of its flexibility, non-stick properties, and transparency to ultraviolet light. However, in thin sheets, PDMS is very difficult to handle because it is elastic, tears easily, and tends to stick to itself.

Consequently, there is a need for a low cost, durable, and easy to handle compliant media for carrying an imprint stamp for use in a soft lithography process. There is also a need for a compliant media that can support an imprint stamp having submicron feature sizes. There exists a need for a compliant media that is optically transparent, particularly to ultraviolet light. Finally, there is a need for a compliant media that is flexible, durable, and can be connected with a belt or a cylinder.

SUMMARY OF THE INVENTION

Broadly, the present invention is embodied in a method for replicating a high resolution three-dimensional imprint pattern on a compliant media of arbitrary size. The compliant media can be connected with a flexible belt material or it can be connected with a cylinder. The compliant media carries an imprint stamp that can include features having a submicron (i.e. less than 1.0 $\mu$m) feature size. The compliant media can be made any size and the imprint patterns carried by the compliant media can be made from the same master substrate or from different master substrates.

Advantages of the compliant media of the present invention include it can be manufactured at a low cost in a bench top laboratory environment, the compliant media is durable, flexible, and can be made from optically transparent materials, particularly, materials that are optically transparent to ultraviolet light. The compliant media can be connected with an optically transparent belt or cylinder for use in a soft lithography process wherein the imprint stamp carried by the compliant media is used to emboss another substrate that can be coated with a photopolymer material and is then cured by an ultraviolet light source contemporaneously with the embossing step.

Other aspects and advantages of the present invention will become apparent from the following detailed description, taken in conjunction with the accompanying drawings, illustrating by way of example the principles of the present invention.

BRIEF DESCRIPTION OF THE DRAWINGS

FIGS. 22 and 23 depict coating and spreading a silicone-based elastomer material over of a photopolymer shim and a shim stock according to the present invention.

FIG. 24 depicts a heating of a support substrate according to the present invention.

DETAILED DESCRIPTION

Figure 1:
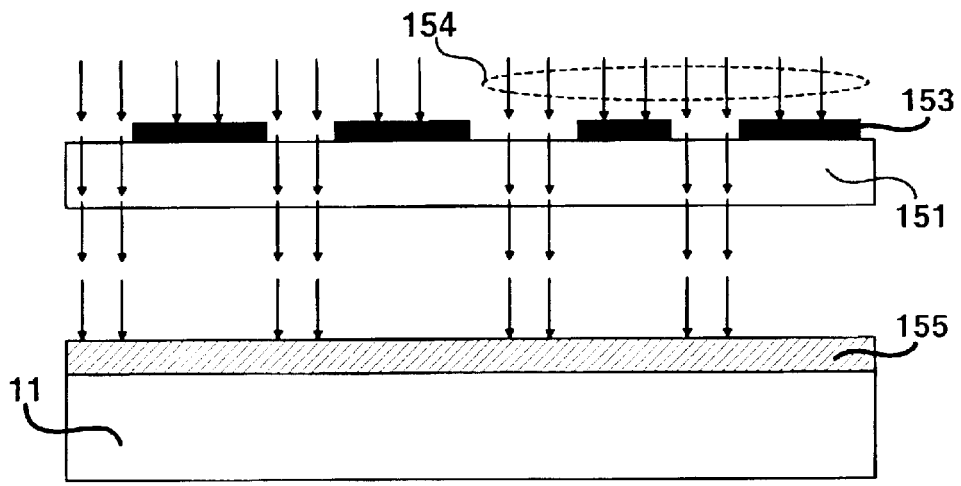
FIGS. 1 through 5 depict patterning and etching a master substrate to define an imprint pattern according to the present invention.

In the following detailed description and in the several figures of the drawings, like elements are identified with like reference numerals.

As shown in the drawings for purpose of illustration, the present invention is embodied in a method for fabricating a high resolution three-dimensional imprint pattern on a compliant media of arbitrary size. The compliant media can be connected with another substrate such as a cylinder or a belt. The belt can be a flexible belt. After connection with the substrate, the imprint pattern can be used as part of a lithographic print process, wherein, another coated substrate is passed under the belt or cylinder and the imprint pattern on the compliant media is embossed (i.e. transferred) to the coated substrate. The coated substrate can be coated with a material such as a photopolymer and the photopolymer can be cured contemporaneously with the embossing in order to fix the imprinted pattern in the photopolymer.

In FIGS. 1 through 4, a master substrate 11 is patterned and then etched to form an imprint pattern 20 therein. In FIG. 1, the master substrate 11 is coated with a material 155 that will serve as an etch mask. The material 155 can be a photoresist material that is commonly used in the microelectronics art. A mask 151 that carries a pattern 153 to be formed in the master substrate 11 is illuminated with light 154 which exposes the material 155 with the pattern 153.

Figure 2:
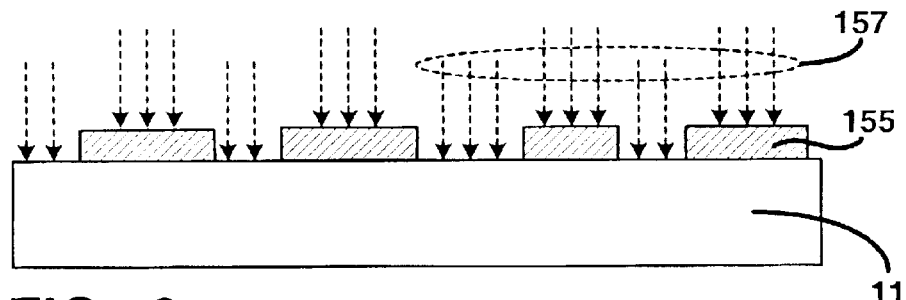
Figure 3:
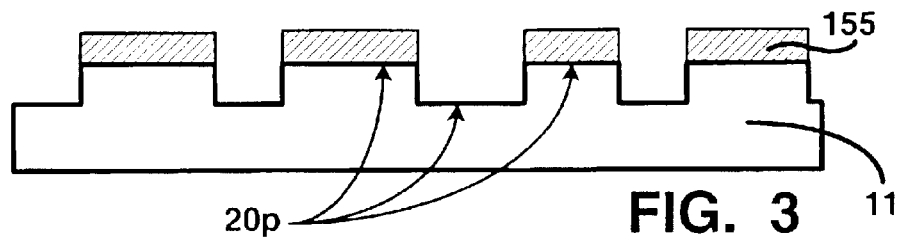
Figure 4:
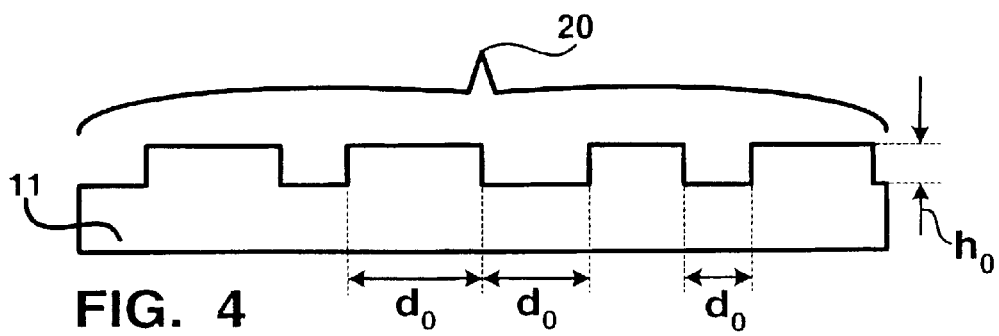

In FIG. 2, the material 155 is developed to remove those portions of the material 155 that were exposed to the light 154. In FIGS. 2 and 3, the master substrate 11 is etched with an etch material to remove those portions of the master substrate 11 that are not covered with the material 155. As a result, in FIG. 3, a plurality of imprint patterns 20p are formed in the master substrate 11. In FIG. 4, the imprint patterns 20p define an imprint stamp 20 on the master substrate 11.

The imprint stamp 20 can include imprint patterns 20p that vary in all three dimensions of width, length, and height. In the cross-sectional view of FIG. 4 and the top plan view of FIG. 5, the imprint patterns 20p vary in a width dimension $d_0$, a height dimension $h_0$, and a length dimension $L_0$. The actual dimensions of the imprint patterns 20p will be application dependent and will depend to a large extent on the lithography process used for the patterning the material 155. For example, if a state-of-the-art microelectronics lithography process is used, then the dimensions ($d_0$, $h_0$, $L_0$) can be of a sub-micrometer scale, that is, less than 1.0 μm. For instance, the imprint patterns 20p can be nano-imprint patterns that can have dimensions ($d_0$, $h_0$, $L_0$) of 100.0 nm or less. Accordingly, the imprint stamp 20 would be a nano-imprint stamp with imprint patterns 20p that have nanometer-size dimensions ($d_0$, $h_0$, $L_0$).

Lithography processes that are well understood in the microelectronics art can be used to pattern and etch the master substrate 11. For example, a photolithography process using a photoresist for the material 155 and an etch process such as reactive ion etching (RIE) can be used to form the imprint stamp 20 in the master substrate 11.

Figure 5:
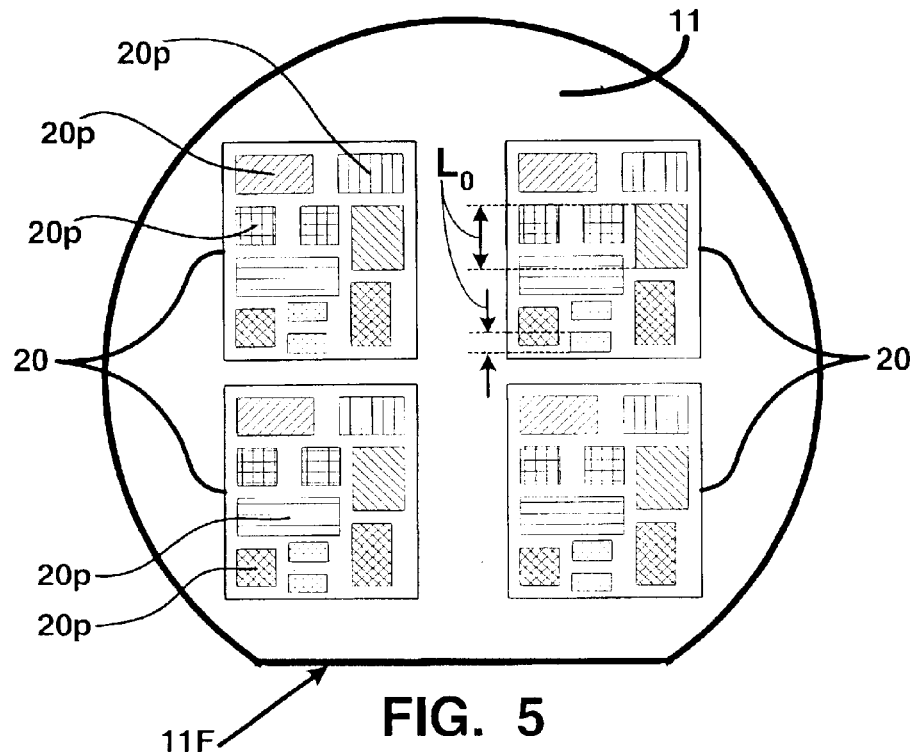

Suitable materials for the master substrate 11 include but are not limited to a silicon (Si) substrate and a silicon (Si) wafer. In FIG. 5, the master substrate 11 is a silicon wafer with a wafer flat 11F. Four of the imprint stamps 20 are formed in the master substrate 11. The silicon wafer can be any size. For example a 4.0 inch silicon wafer was used as the master substrate 11 for four of the imprint stamps 20. Larger diameter silicon wafers (e.g. 8 inch or 12 inch) can be used to provide a larger surface area for more of the imprint stamps 20 or for larger imprint stamps 20. Although the imprint patterns 20p appear to be identical in FIG. 5, the imprint stamps 20 can include imprint patterns 20p that vary (i.e are not identical) among the imprint stamps 20.

Figure 6:
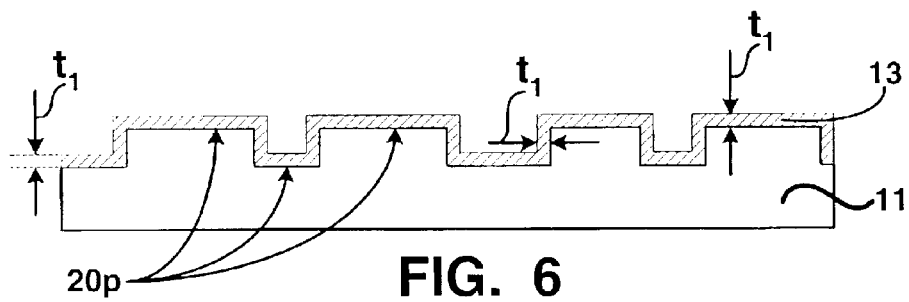
FIG. 6 depicts a release layer conformally deposited on an imprint pattern according to the present invention.

In FIG. 6, a release layer 13 is deposited over the imprint patterns 20p. The release layer 13 includes a first thickness $t_1$ that is operative to conformally coat the imprint patterns 20p such that the first thickness $t_1$ is substantially equally thick on the vertical and the horizontal surfaces of the imprint patterns 20p. Suitable materials for the release layer 13 include but are not limited to a fluorocarbon material. As an example, the fluorocarbon material for the release layer 13 can be deposited using a plasma deposition of a trifluoromethane ($CHF_3$) gas for about 5.0 minutes.

The first thickness $t_1$ will be application dependent; however, as will be discussed below, the release layer 13 is operative to provide a non-stick surface upon which to apply a silicone-based elastomer material that will later be released from the release layer 13. Therefore, the release layer 13 can be a very thin layer having a first thickness $t_1$ that is from about 50.0 nm to about 150.0 nm thick.

Figure 7:
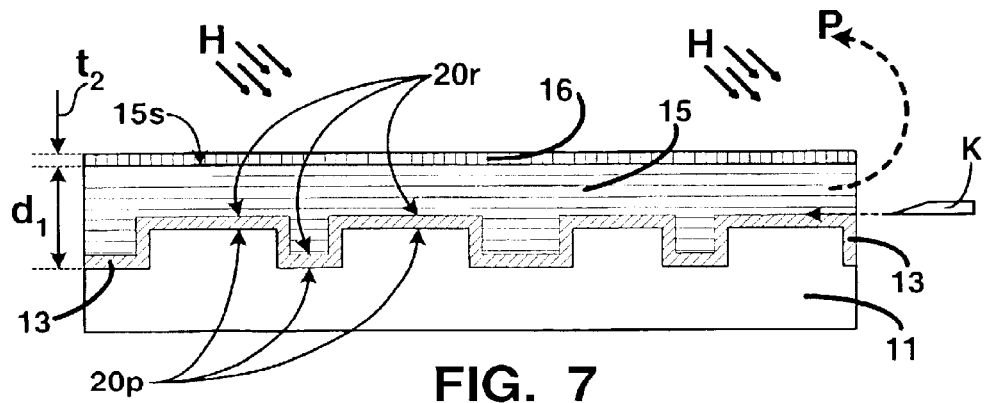
FIG. 7 depicts a silicon-based elastomer layer deposited over a release layer according to the present invention.

In FIG. 7, a silicone-based elastomer layer 15 is deposited over the release layer 13 to a first depth $d_1$ that completely covers the imprint patterns 20p. To obtain a uniform thickness for the silicone-based elastomer layer 15, the master substrate 11 should be substantially level. This can be accomplished by placing the master substrate 11 on a level surface or a level vacuum chuck prior to depositing the silicone-based elastomer layer 15, for example.

The silicone-based elastomer layer 15 is then cured by heating H the master substrate 11. The curing can be accomplished by baking the master substrate 11 at a predetermined temperature for a predetermined amount of time. The actual time and temperature will be application dependent and will also depend on the type of material used for the silicone-based elastomer layer 15. Suitable materials for the silicone-based elastomer layer 15 include but are not limited to Polydimethyl Siloxane (PDMS), DOW CORNING® silicone-based conformal coatings including SYLGARD® 182 silicone elastomer, SYLGARD® 183 silicone elastomer, SYLGARD® 184 silicone elastomer, and SYLGARD® 186 silicone elastomer.

The first depth $d_1$ of the silicone-based elastomer layer 15 can be application dependent. However, in a preferred embodiment, the first depth $d_1$ of the silicone-based elastomer layer 15 is from about 0.5 mm to about 1.5 mm. For PDMS or the DOW CORNING® SYLGARD® silicone-based elastomers, the curing of the silicone-based elastomer layer 15 can be accomplished by baking the master substrate 11 in an oven or the like. The predetermined temperature and the predetermined amount of time for the curing can be for about 4.0 hours at a temperature of about 100.0° C.

In an alternative embodiment, also illustrated in FIG. 6, prior to the above mentioned curing step, a cover layer 16 having a second thickness $t_2$ is applied over the already deposited silicone-based elastomer layer 15. Preferably, the cover layer 16 is a Polyester film and the second thickness $t_2$ is from about 50.0 μm to about 150.0 μm. The cover layer 16 may be used to planarize any surface anomalies in the silicone-based elastomer layer 15 that cause deviations from a substantially planar surface 15s of the silicone-based elastomer layer 15.

Figure 8:
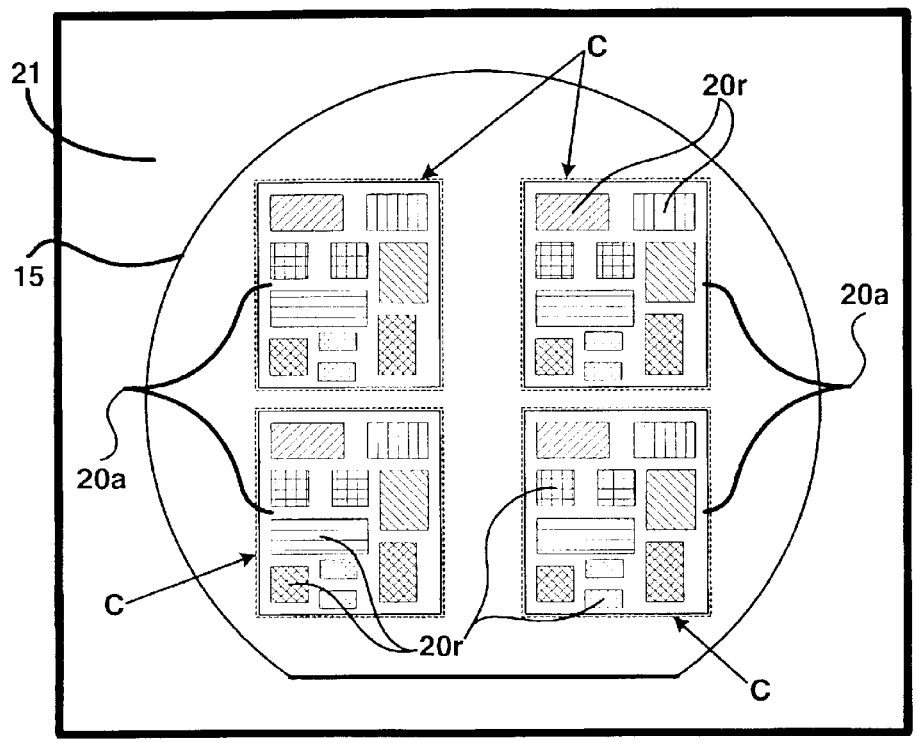
FIGS. 8 through 10 depict separating a silicon-based elastomer layer from a release layer to form an imprint stamp according to the present invention.
Figure 9:
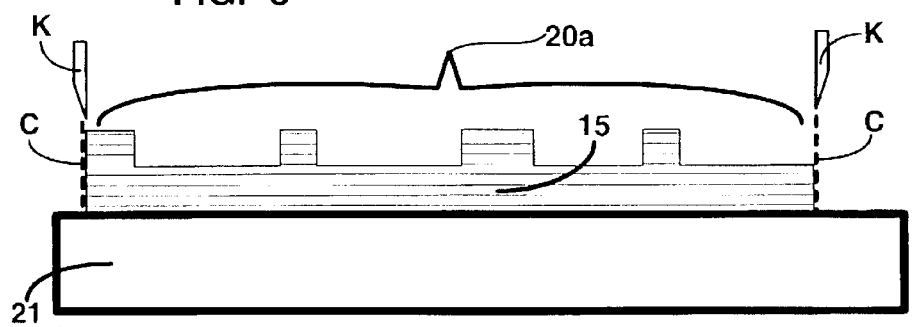
Figure 10:
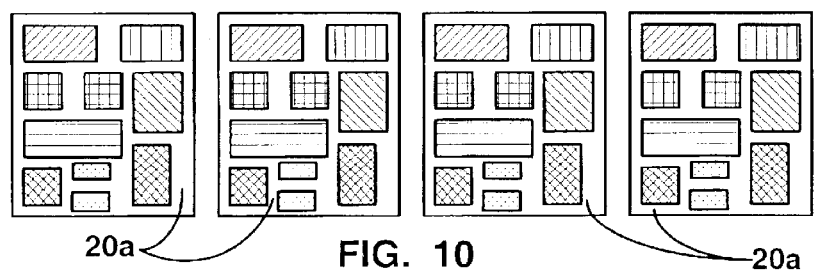

After the curing step, a complementary image of the imprint patterns 20p are replicated 20r in the silicone-based elastomer layer 15 such that an imprint stamp 20a is formed in the silicone-based elastomer layer 15 (see FIGS. 8 through 10).

In FIG. 7, after the curing step, the silicone-based elastomer layer 15 is released from the release layer 13. A tip of a pair of tweezers or an edge of a knife or razor, such as an X-Acto® Knife, can be used to separate the silicone-based elastomer layer 15 from the release layer 13 as depicted by a knife edge K and a dashed arrow inserted between the silicone-based elastomer layer 15 and the release layer 13. The silicone-based elastomer layer 15 can then be lifted off of the release layer 13 by grabbing an edge of the silicone-based elastomer layer 15 and peeling off (see dashed arrow P) the silicone-based elastomer layer 15 from the release layer 13. If the above mentioned cover layer 16 is used, then the cover layer 16 is removed from the silicone-based elastomer layer 15 before the silicone-based elastomer layer 15 is released from the release layer 13.

In FIGS. 8, 9, and 10, the imprint stamp 20a is removed from an excess portion of the silicone-based elastomer layer 15 that surrounds the imprint stamp 20a. If the above mentioned cover layer 16 is used, then the imprint stamp 20a is removed from an excess portion of the silicone-based elastomer layer 15 and the cover layer 16 that surround the imprint stamp 20a.

In either case, the imprint stamp 20a can be removed from the excess portion by placing the silicone-based elastomer layer 15 on a substantially flat substrate 21 and then cutting C around a perimeter (see dashed lines in FIGS. 8 and 9) of the imprint stamp 20a to release the excess portions of the silicone-based elastomer layer 15 or the silicone-based elastomer layer 15 and the cover layer 16 from the imprint stamp 20a. A knife, razor, die, or the like can be used to accomplish the cutting as depicted by a knife K in FIG. 9. After the imprint stamp 20a has been released, the excess portions (15, or 15 and 16) can be peeled off of the substantially flat substrate 21 so that the imprint stamp 20a is no longer connected with the excess portions (see FIG. 10). The substantially flat substrate 21 can be a material including but not limited to a glass, a metal, a plastic, and quartz. For example, the substantially flat substrate 21 can be a glass plate.

Optionally, the above mentioned steps may be repeated as necessary to produce additional imprint stamps 20a using the master substrate 11. One advantage of the present invention is that the master substrate 11 is not damaged by the aforementioned process steps. Consequently, the same master substrate 11 can be repeatedly used to produce several imprint stamps 20a. Therefore, the cost of patterning and etching the master substrate 11 and depositing the release layer 13 can be amortized over several imprint stamps 20a.

Another advantage of the present invention is that the master substrate 11 need not be cleaned after each use in order to remove contaminants, such as dust particles, because the silicone-based elastomer layer 15 flows around the particles and entrains them. Consequently, the master substrate 11 is self-cleaning because the particles are removed with the silicone-based elastomer layer 15.

Figure 11:
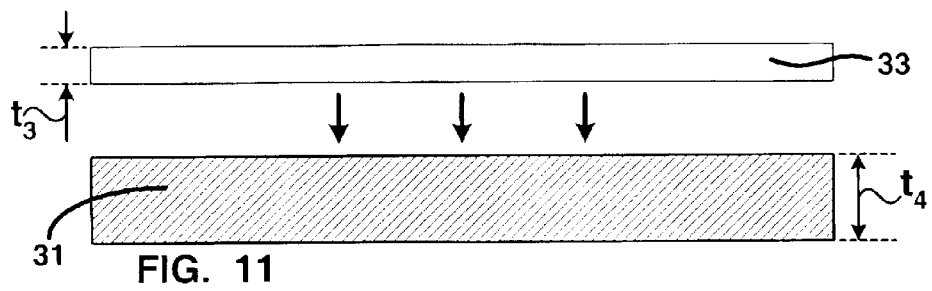
FIG. 11 depicts applying a thin plastic film to a silicone rubber backing according to the present invention.

In FIG. 11, a flat and thin plastic film 33 having a third thickness $t_3$ is placed on a flat and compliant silicone rubber backing 31 having a fourth thickness $t_4$. Suitable materials for the thin plastic film 33 include but are not limited to a Polymide and a Polyester (PET, Polyethylene Terephthalate). The third thickness $t_3$ and the fourth thickness $t_4$ will be application dependent. Preferably, the third thickness $t_3$ of the thin plastic film 33 is from about 40.0 µm to about 100.0 µm and the fourth thickness $t_4$ of the silicone rubber backing 31 is from about 0.125 inches to about 0.25 inches. The fourth thickness $t_4$ of the silicone rubber backing 31 should be selected to ensure the silicone rubber backing 31 is complaint (i.e. not stiff).

Figure 12:
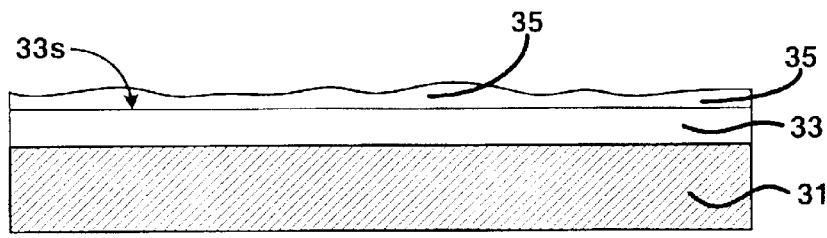
FIG. 12 depicts a coating of a thin plastic film with a photopolymer solution according to the present invention.

In FIG. 12, a surface 33s of the thin plastic film 33 is coated with a photopolymer solution 35. The photopolymer solution 35 can include but is not limited to a mixture of about 50% of a photopolymer material and about 50% acetone. As will be describe below, the acetone will evaporate leaving a substantially photopolymer layer on the surface 33s of the thin plastic film 33. The photopolymer material can include but is not limited to a Norland™ Optical Adhesive that cures when exposed to ultraviolet light. Preferably, the photopolymer material will cure in a time from about 5.0 seconds to about 60.0 seconds. For example, a Norland® NOA 83H photopolymer can be used for the photopolymer solution 35.

Figure 13:
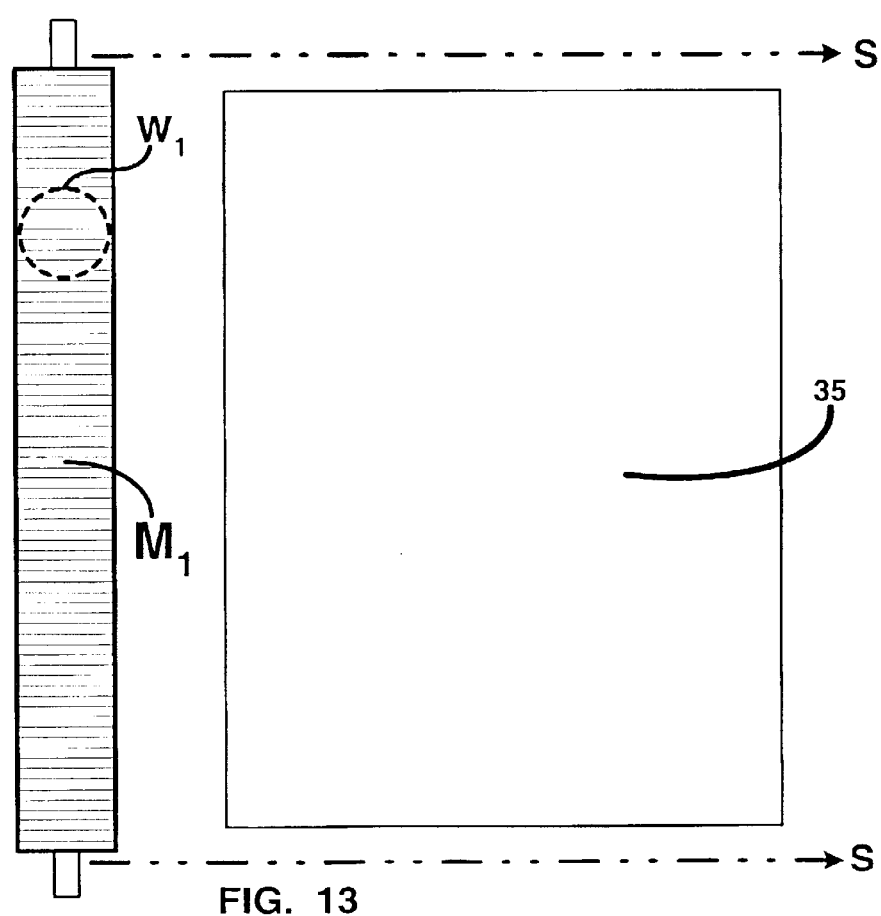
FIGS. 13 and 14 depict a spreading of a photopolymer solution to form a photopolymer layer over a thin plastic film according to the present invention.
Figure 14:
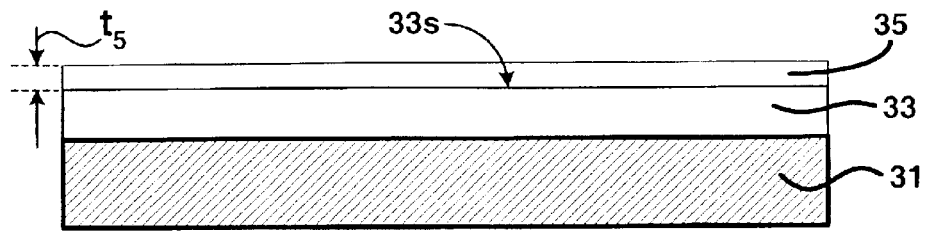

In FIGS. 13 and 14, the photopolymer solution 35 is spread over the surface 33s of the thin plastic film 33 to form a photopolymer layer 35 having a fifth thickness $t_5$. Preferably, the spreading of the photopolymer solution 35 is accomplished using a Mayer bar $M_1$ that is wound with a wire $W_1$ having a first diameter. The Mayer bar $M_1$ slides S over the surface 33s and meters the photopolymer solution 35 so that the photopolymer layer 35 having a fifth thickness $t_5$ is formed. Any acetone in the photopolymer solution 35 substantially evaporates during the spreading process. As a result, the photopolymer layer 35 comprises substantially a photopolymer material as described above. Preferably, the fifth thickness $t_5$ of the photopolymer layer 35 is from about 5.0 µm to about 10.0 µm. The first diameter of the wire $W_1$ will be application dependent. Preferably, the first diameter of the wire $W_1$ is from about 50.0 µm micrometers to about 100.0 µm.

Figure 15:
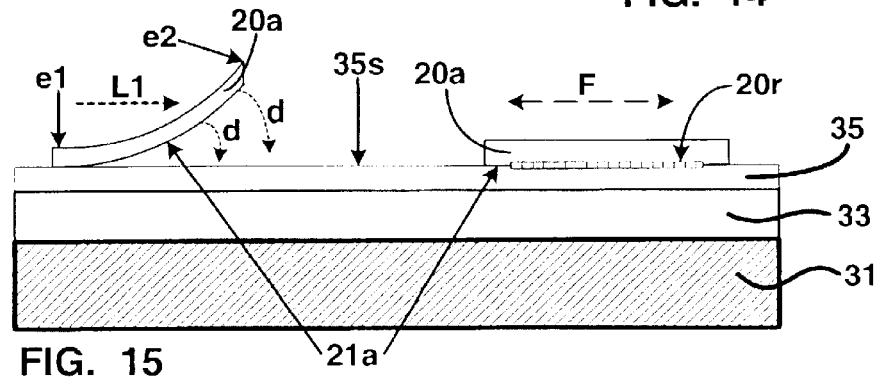
FIG. 15 depicts a placing of a patterned side of an imprint stamp on a photopolymer layer according to the present invention.

In FIG. 15, a patterned surface 21a of the imprint stamp 20a is placed on the photopolymer layer 35. Placing the imprint stamp 20a on the photopolymer layer 35 can include placing an edge e1 of the imprint stamp 20a in contact with the photopolymer layer 35 and holding the edge e1 down while progressively lowering see arrows L1 and d) a remainder of the patterned surface 21a into contact with the photopolymer layer 35. A pair of tweezers or a suction wand can be used to grasp an edge e2 to accomplish the lowering and to hold the edge e1 down. Alternatively, a rubber roller or the like can be used in conjunction with the progressive lowering to bring the patterned surface 21a into contact with the photopolymer layer 35.

One advantage to the progressive lowering is that air entrapped between the photopolymer layer 35 and the patterned surface 20r is displaced so that air bubbles that can cause defects are not trapped between the photopolymer layer 35 and the patterned surface 20r.

Another advantage of the present invention is that once the imprint stamp 20a has been placed on the photopolymer layer 35, the imprint stamp 20a can be floated (see dashed arrow F) over a surface 35s of the photopolymer layer 35 to position the imprint stamp 20a at a predetermined location on the photopolymer layer 35. The floating F can be done manually using a tweezer or suction wand, or the floating F can be automated and a precision mechanical device, such as a robotic end effector, can be used to precisely position the imprint stamp 20a.

Figure 16:
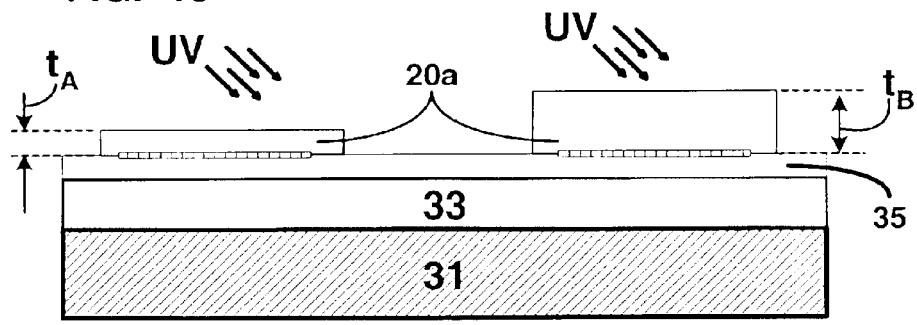
FIG. 16 depicts curing a photopolymer layer according to the present invention.

In FIG. 16, the photopolymer layer 35 is cured to fix a position of the imprint stamp 20a on the photopolymer layer 35 and to transfer an image of the imprint pattern 20r to the photopolymer layer 35. The photopolymer layer 35 is cured by irradiating the photopolymer layer 35 with an ultraviolet light UV of a predetermined intensity for a first time period. The photopolymer layer 35 hardens as it cures and an the image of the imprint pattern 20r that is transferred into the photopolymer layer 35 also hardens and is fixed in the photopolymer layer 35 as an imprint pattern 20s.

The ultraviolet light UV can have a wavelength that includes but is not limited a range from about 300 nm to about 400 nm. The predetermined intensity of the ultraviolet light UV can include but is not limited to an intensity of about 150 mW/cm². The first time period can include but is not limited to a time period from about 5.0 seconds to about 60.0 seconds. For example, the ultraviolet light UV can be from a UVA ultraviolet light source.

Another advantage of the present invention is that the imprint stamps 20a that are used to pattern the photopolymer layer 35 can have a thickness (see $t_A$ and $t_B$ in FIG. 16) that can vary and those variations in thickness will not effect the accuracy of the transfer of the imprint pattern 20r to imprint pattern 20s of the photopolymer layer 35. The variations in thickness ($t_A$ and $t_B$) can be due to variations in the process used to make the imprint stamps 20a, variations in the first depth do of FIG. 7, or the use of different master substrates 11 to make different imprint stamps 20 with different imprint patterns 20p.

Figure 17:
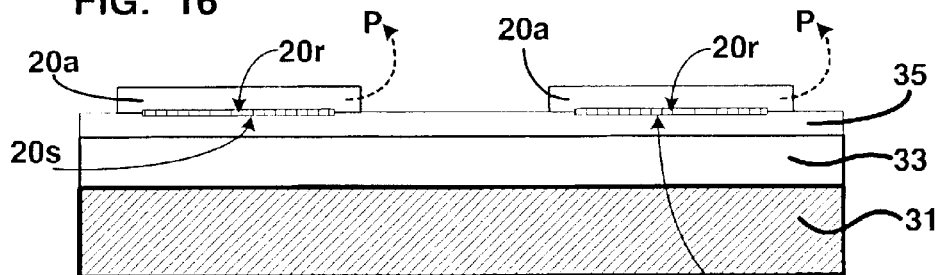
FIG. 17 depicts removing an imprint stamp from a photopolymer layer according to the present invention.
Figure 18:
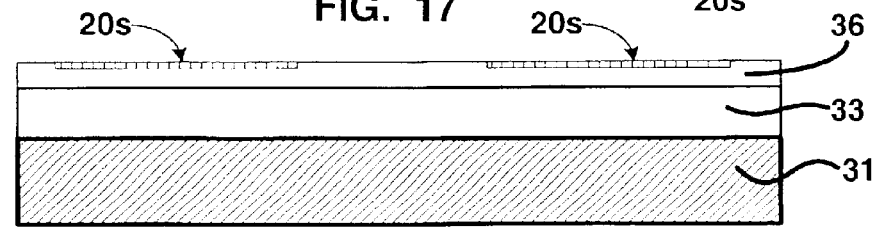
FIG. 18 depicts a photopolymer shim formed in a photopolymer layer according to the present invention.

After the curing step, in FIGS. 17 and 18, the imprint stamps 20a are removed P from the photopolymer layer 35 so that the image of the imprint pattern 20r defines a photopolymer shim 36 with the imprint pattern 20s fixed therein. The imprint stamps 20a can be removed P using a pair of tweezers or the like to grab an edge (e1 or e2) and then lift the imprint stamps 20a from the photopolymer layer 35 (see dashed arrow P).

Figure 19:
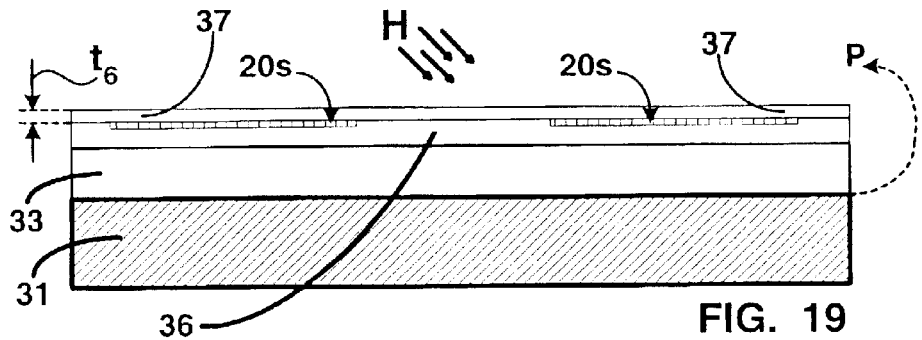
FIG. 19 depicts a fluorocarbon coating deposited on a photopolymer shim according to the present invention.

In FIG. 19, the photopolymer shim 36 is post-cured by heating the photopolymer shim 36. The post-curing of the photopolymer shim 36 can include but is not limited to a time of about 1.0 hour at a temperature of about 100° C. Optionally, after the post-curing step, the photopolymer shim 36 can be rinsed with an acetone solution to remove chemical species which might inhibit curing of a silicone based elastomer material such as PDMS or the above mentioned SYLGARD® silicone-based elastomers. The post-curing of the photopolymer shim 36 drives off cure-inhibiting species and improves an adhesion of the photopolymer shim 36 to the thin plastic film 33.

In FIG. 19, after the post-curing of the photopolymer shim 36, a coating of a fluorocarbon material 37 having a sixth thickness $t_6$ is deposited on the photopolymer shim 36. The sixth thickness $t_6$ can include but is not limited to a thickness from about 50.0 nm to about 150.0 nm. As an example, the fluorocarbon material 37 can be deposited using a plasma deposition of a trifluoromethane ($CHF_3$) gas for about 5.0 minutes.

In FIG. 19, after the deposition of the fluorocarbon material 37, a tweezer or a knife edge can be inserted between the thin plastic film 33 and the silicone rubber backing 31 and the thin plastic film 33 can be pulled off of the silicone rubber backing 31 as shown by the dashed arrow P. Hereinafter, the combination of the photopolymer shim 36 and the thin plastic film 33 will be referred to as the photopolymer shim 36 unless otherwise noted.

Figure 20:
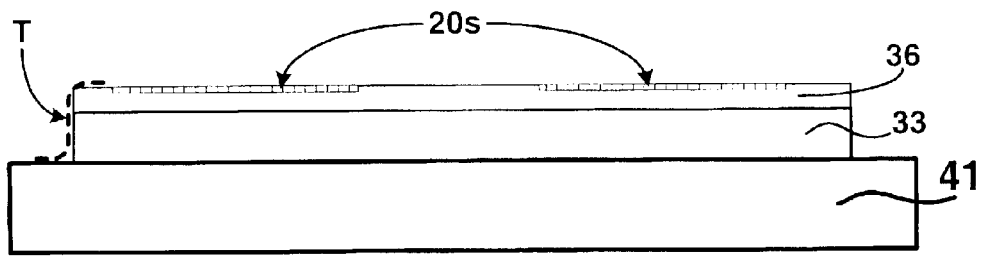
FIG. 20 depicts a photopolymer shim attached to a support substrate according to the present invention.

In FIG. 20, after the thin plastic film 33 is separated, the photopolymer shim 36 is attached to a support substrate 41. The photopolymer shim 36 can be connected with the support substrate 41 by laying the photopolymer shim 36 on the support substrate 41 and fastening an end of the photopolymer shim 36 to the support substrate 41 using an adhesive. For example, a high temperature adhesive tape T can be used. The support substrate 41 can be made from a material including but not limited to a glass and quartz.

Figure 21:
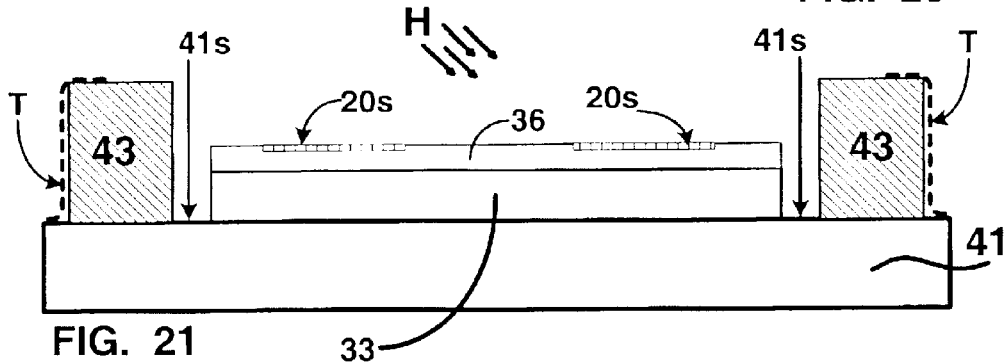
FIG. 21 depicts a shim stock attached to a support substrate and a pre-heating of the support substrate according to the present invention.
Figure 22:
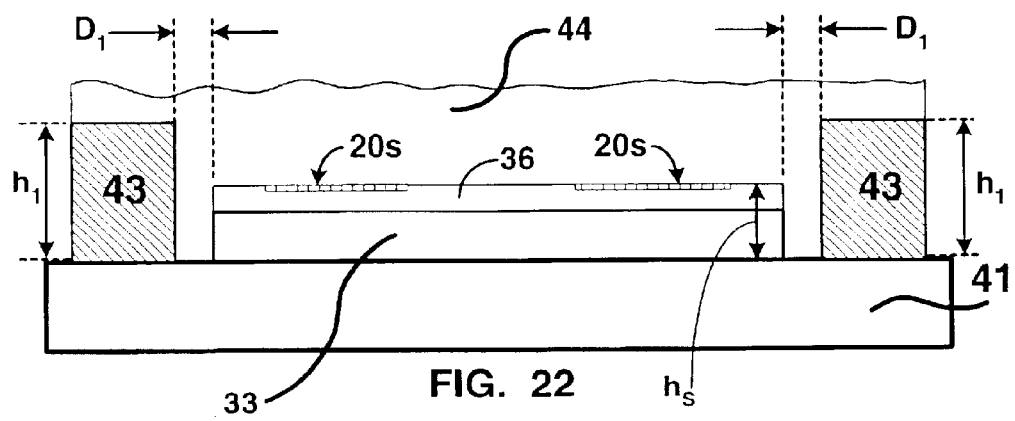

In FIGS. 21 and 22, a shim stock 43 having a first height $h_1$ is attached to the support substrate 41. The shim stock 43 can be connected with the support substrate 41 using an adhesive such as the above mentioned high temperature adhesive tape T, for example. The shim stock 43 is positioned adjacent to the photopolymer shim 36 and is spaced apart from the photopolymer shim 36 by a first distance $D_1$ so that there is a space between the shim stock 43 and the photopolymer shim 36 on a surface 41s of the support substrate 41. The first height $h_1$ of the shim stock 43 should exceed a height $h_s$ of the photopolymer shim 36 as depicted in FIG. 22. The first height $h_1$ and the first distance $D_1$ will be application dependent; however, the first height $h_1$ can be in a range including but not limited to from about 0.5 mm to about 1.5 mm and the first distance $D_1$ can be in a range including but not limited to from about 1.0 mm to about 2.0 mm. The shim stock 43 can be a material including but not limited to a metal, a glass, quartz, and stainless steel. For instance, the shim stock 43 can be a stainless steel shim stock and the first height $h_1$ can be about 0.5 mm.

In FIG. 21, the support substrate 41 is preheated H to increase a temperature of the support substrate 41 in preparation for a coating of the shim stock 43 and the photopolymer shim 36 with a silicone-based elastomer material as will be discussed below. Preferably, the silicone-based elastomer material is not coated on a cold or on a room temperature (i.e. from about 18.0° C. to about 28.0° C.) support substrate 41. The preheated temperature for the support substrate 41 will be application dependent and the temperature should not exceed a temperature limit of the photopolymer shim 36. For example, the support substrate 41 can be preheated to a temperature of about 100° C. A temperature of about 100° C. is below the temperature limits of most photopolymer materials.

In FIGS. 22 and 23, the photopolymer shim 36 and the shim stock 43 are coated with a compliant material 44 that completely covers the photopolymer shim 36 and the shim stock 43 (see FIG. 22). Suitable materials for the compliant material 44 include but are not limited to a silicone-based elastomer material and an amorphous fluoropolymer material.

Suitable silicone-based elastomer materials include but are not limited to Polydimethyl Siloxane (PDMS), DOW CORNING® silicone-based conformal coatings including SYLGARD® 182 silicone elastomer, SYLGARD® 183 silicone elastomer, SYLGARD® 184 silicone elastomer, and SYLGARD® 186 silicone elastomer. Preferably, the PDMS is a mixture of about 10.0 parts of a base and about 1.5 parts of a curing agent. The base and the curing agent can be mixed by weight or by volume as they have the same density.

A suitable material for the amorphous fluoropolymer material includes but is not limited to TEFLON® AF. For example, a DuPont™ TEFLON® AF has been used for the compliant material 44. When the compliant material 44 comprises the amorphous fluoropolymer material, the above mentioned preheating step of FIG. 21 is not required.

In FIGS. 23 and 24, the compliant material 44 is spread over the photopolymer shim 36 and the shim stock 43 to form a compliant media 45 that covers the photopolymer shim 36 and the shim stock 43 (see thicknesses $t_8$ and $t_9$ in FIG. 24). The imprint pattern 20s in the photopolymer shim 36 is transferred to the compliant media 45 so that an imprint stamp 20t is formed in the compliant media 45.

Preferably, the spreading of the compliant material 44 is accomplished using a Mayer bar $M_2$ that is wound with a wire $W_2$ having a second diameter. The Mayer bar $M_2$ slides S over the shim stock 43 and meters the compliant material 44 to form a smooth and uniformly thick compliant media 45. The compliant material 44 will cover the shim stock 43 by a thickness $t_8$ and will cover the photopolymer shim 36 by a thickness $t_9$, where $t_9 >> t_8$. The Mayer bar $M_2$ is wound with a much coarser diameter of wire than the Mayer bar $M_1$ that was discussed above. The second diameter of the wire $W_2$ will be application dependent. Preferably, the second diameter of the wire $W_2$ is from about 1.0 mm to about 3.0 mm. For example, a wire with a diameter of about 1.5 mm can be wound on the Mayer bar $M_2$.

After the spreading, the support substrate 41 is heated H. The surface 41 s is operative to provide a surface for a portion 45c of the compliant media 45 to adhere to during and after the heating step. The time and temperature for the heating H of the substrate 41 will be application dependent, and as before, the temperature must not exceed a temperature limit for the photopolymer shim 36 or for the compliant media 45. As an example, the support substrate 41 can be heated H for about 4.0 hours at a temperature of about 100.0° C. when the compliant media 45 is made from the silicone-based elastomer material. The heating H cures the silicone-based elastomer material. Alternatively, the support substrate 41 can be heated H for about 4.0 hours at a temperature of about 60.0° C. when the compliant media is made from the amorphous fluoropolymer material. In this case, the heating H drys out the amorphous fluoropolymer material.

After the heating step, the support substrate 41 is cooled down. Preferably, the support substrate 41 is allowed to cool down to a temperature of about a room temperature (i.e. from about 18.0° C. to about 28.0 ° C.).

After the support substrate 41 has cooled down, the shim stock 43 is removed from the support substrate 41. In FIG. 24, the shim stock 43 can be removed by cutting K the compliant media 45 along an edge of the shim stock 43 that is adjacent to the photopolymer shim 36. A knife, razor, or the like can be used to cut K the compliant media 45. After the compliant media 45 is cut K, the shim stock 43 can be pulled off of the support substrate 41. The edge of the shim stock 43 (see dashed line for K) should be used as a guide for making the cut K because the portion 45c of the compliant media 45 adheres to the surface 41s of the support substrate 41 and the adhesion prevents the compliant media 45 from being prematurely separated from the substrate 41.

Figure 25:
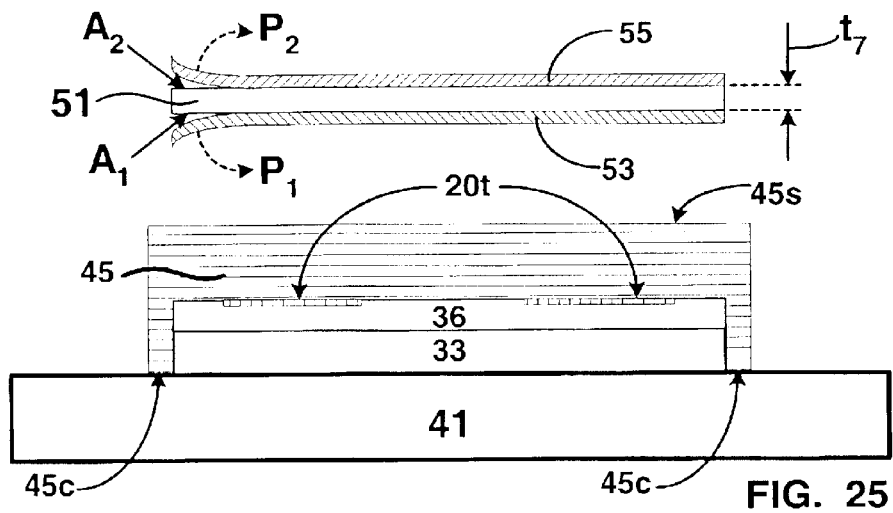
FIGS. 25 through 27 depict applying a transfer adhesive to a compliant media according to the present invention.
Figure 26:
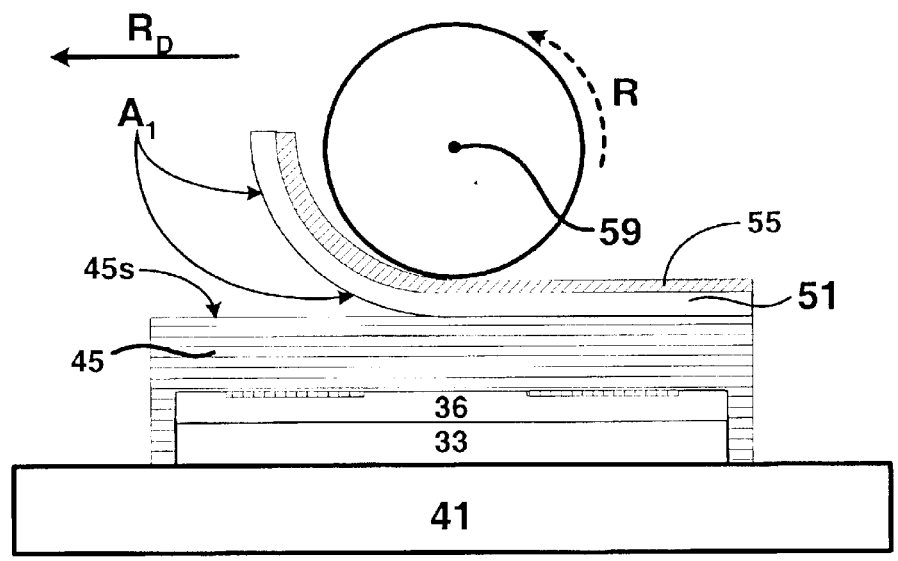
Figure 27:
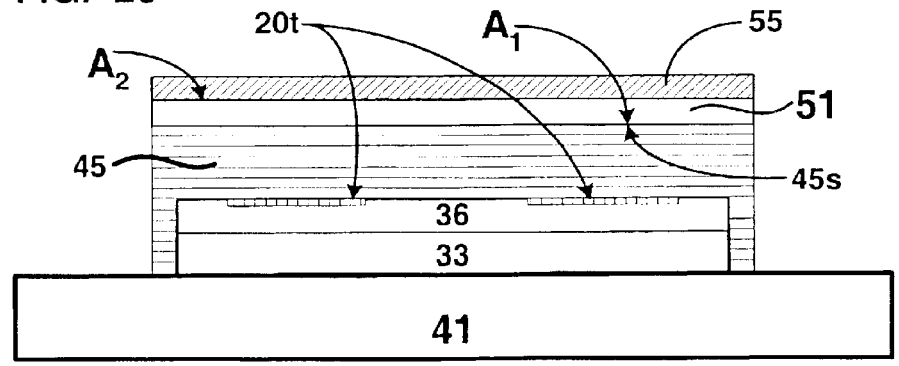

In FIGS. 25 through 27, a first adhesive surface $A_1$ of a transfer adhesive layer 51 is applied to a surface 45s of the compliant media 45 so that the transfer adhesive layer 51 adheres to the compliant media 45. The transfer adhesive layer 51 includes a seventh thickness $t_7$ and a second adhesive surface $A_2$ as will be described below.

In FIG. 25, the first adhesive surface $A_1$ can be exposed, prior to being applied to the surface 45s, by peeling back $P_1$ a first backing 53 from the transfer adhesive layer 51. Similarly, the second adhesive surface $A_2$ can be exposed by peeling back $P_2$ a second backing 55 from the transfer adhesive layer 51. The first adhesive surface $A_1$ can be connected with the surface 45s by using a roller 59 (see FIG. 26).

In FIG. 26, the first adhesive surface $A_1$ is positioned at an edge of the compliant media 45 and then the roller 59 is rolled R across the second backing 55 to progressively apply the first adhesive surface $A_1$ across the surface 45s until the entire surface 45s is connected with the first adhesive surface $A_1$ (see FIG. 27). The roller 59 can be a rubber roller, for example. The roller 59 allows the first adhesive surface $A_1$ to be applied to the surface 45s without trapping air between the first adhesive surface $A_1$ and the surface 45s.

The seventh thickness $t_7$ of the transfer adhesive layer 51 will be application dependent. However, because the transfer adhesive layer 51 will remain attached to the compliant media 45 and because it is desirable for the compliant media 45 to be flexible, the transfer adhesive layer 51 should be as thin as possible. Preferably, the seventh thickness $t_7$ of the transfer adhesive layer 51 is from about 20.0 $\mu$m thick to about 100.0 $\mu$m thick.

Preferably, the transfer adhesive layer 51 is an optically transparent material so that another photopolymer material that is brought into contact with the compliant media 45 and the imprint stamp 20t can be cured by a light source that is incident on both the transfer adhesive layer 51 and the compliant media 45 as will be described below.

A suitable optically transparent material for the transfer adhesive layer 51 includes but is not limited to an Adhesives Research, Inc.™ ARclear™ DEV-8932 optically clear silicone adhesive. For instance, a 25.0 $\mu$m thick sheet (i.e the seventh thickness $t_7$=25.0 $\mu$m) of ARclear™ DEV-8932 can be used for the transfer adhesive layer 51.

Figure 28:
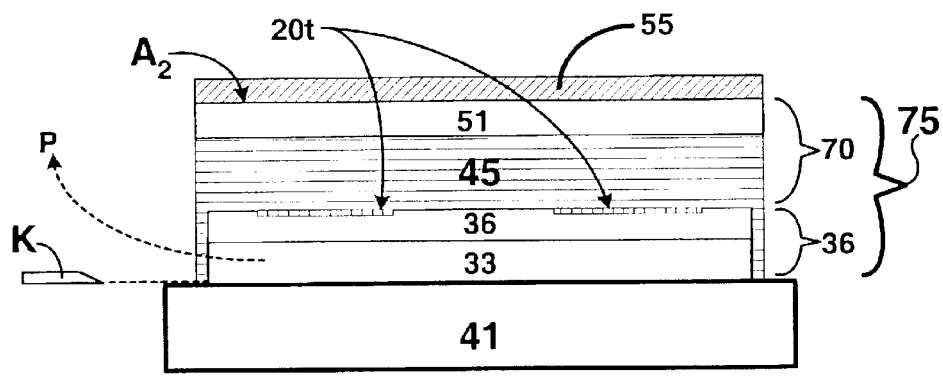
FIG. 28 depicts separating a compliant media from a support substrate according to the present invention.

In FIG. 28, the compliant media 45 can be separated from the support substrate 41 by using a knife, razor, suction wand, tweezer, or the like to initiate the separation of the compliant media 45 from the support substrate 41 as depicted by the knife K.

Figure 29:
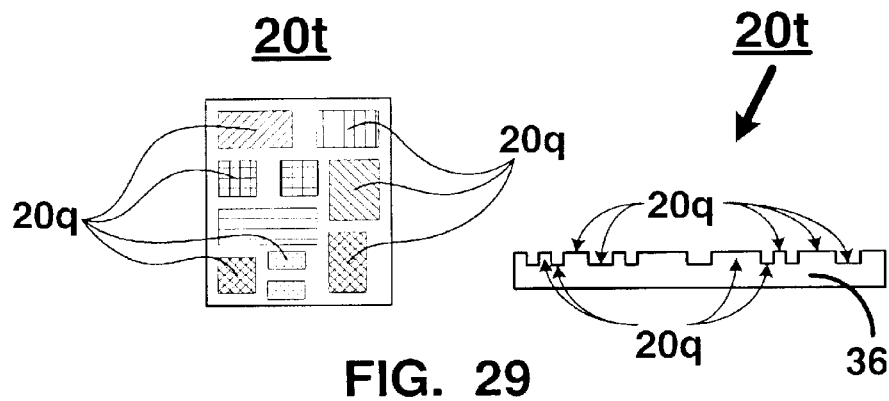
FIG. 29 is a top plan view and a cross-sectional view of an imprint pattern carried by a photopolymer shim according to the present invention.
Figure 30:
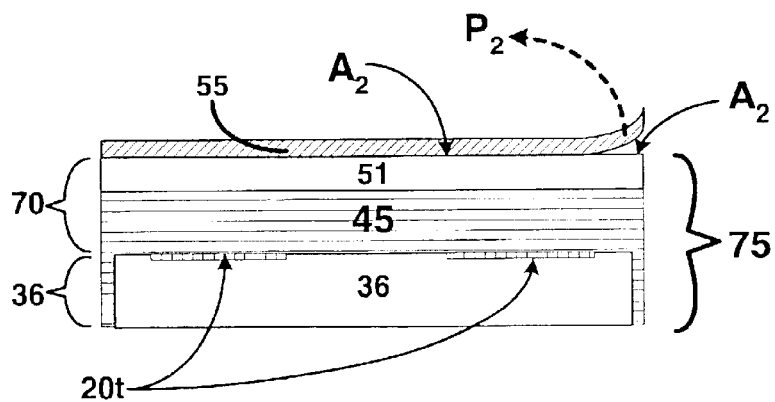
FIG. 30 depicts a compliant assembly according to the present invention.

In FIG. 29, the imprint stamp 20t includes a plurality of patterns 20q formed in the photopolymer shim 36 that complement the patterns 20p on the master substrate 11 (see FIGS. 5 and 6). In FIG. 30, after the peeling, the compliant media 45 is still connected with the photopolymer shim 36 and the thin plastic film 33.

An additional advantage of the present invention is that the photopolymer shim 36 and the thin plastic film 33 layer protect the imprint stamp 20t from damage during subsequent processing and handling steps that will be described below in reference to FIGS. 31 through 37b. Those processing and handling steps can be completed and then the photopolymer shim 36 and the thin plastic film 33 layers can be peeled off to expose the imprint stamp 20t. Because the photopolymer shim 36 and the thin plastic film 33 layers will eventually be separated from the compliant media 45 in order to expose the imprint stamp 20t carried by the compliant media 45, hereinafter, unless otherwise noted, the combination of the layers comprising the photopolymer shim 36 and the thin plastic film 33 will be denoted as the photopolymer shim 36 (see FIG. 30).

Similarly, because the transfer adhesive layer 51 will remain connected with the compliant media 45, the combination of the compliant media 45 and the transfer adhesive layer 51 will be denoted as a compliant media 70. In FIGS. 28 and 30, the combination of the compliant media 70 and the photopolymer shim 36 will be denoted as a compliant assembly 75. As will be described below, the compliant assembly 75 will be connected with a cylinder and a flexible belt material.

Figure 31A:
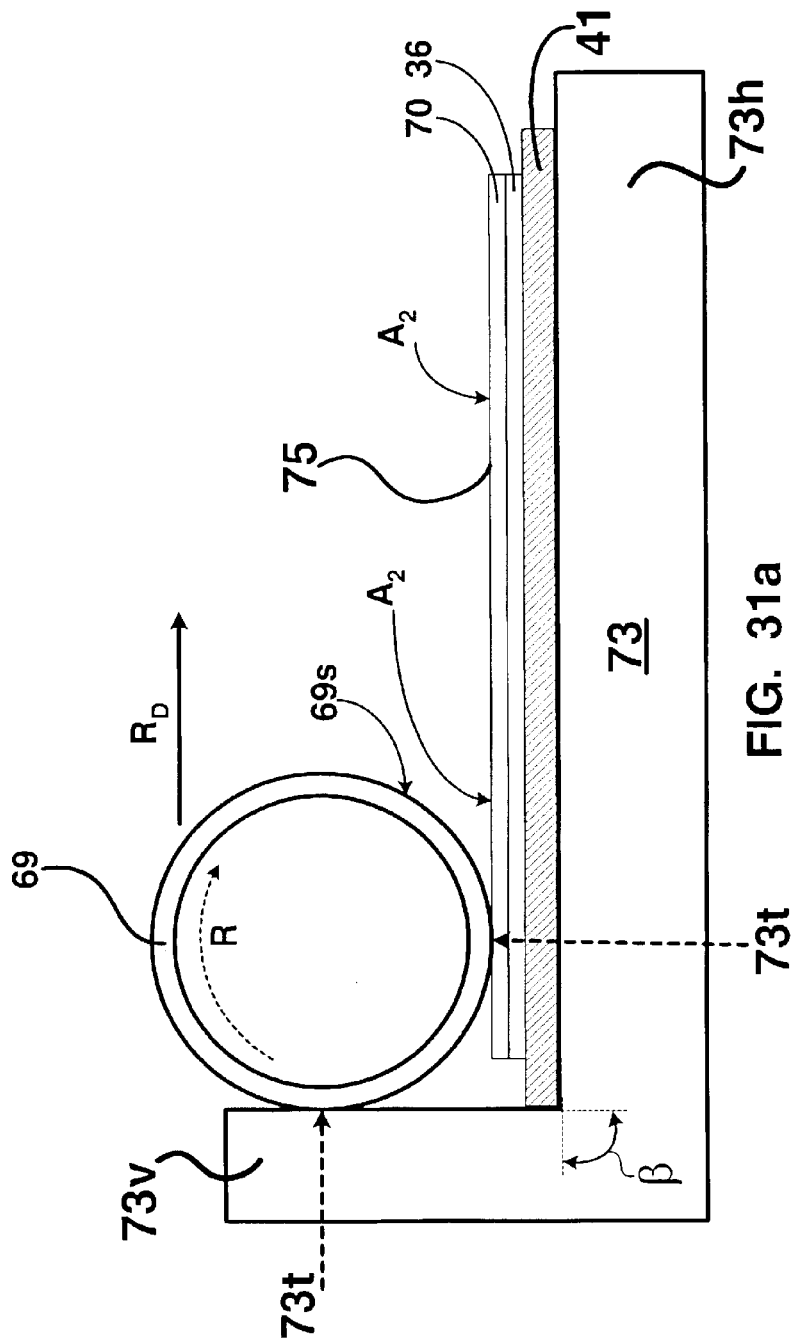
FIGS. 31a through 34b depict attaching a compliant assembly to a cylinder according to the present invention.
Figure 31B:
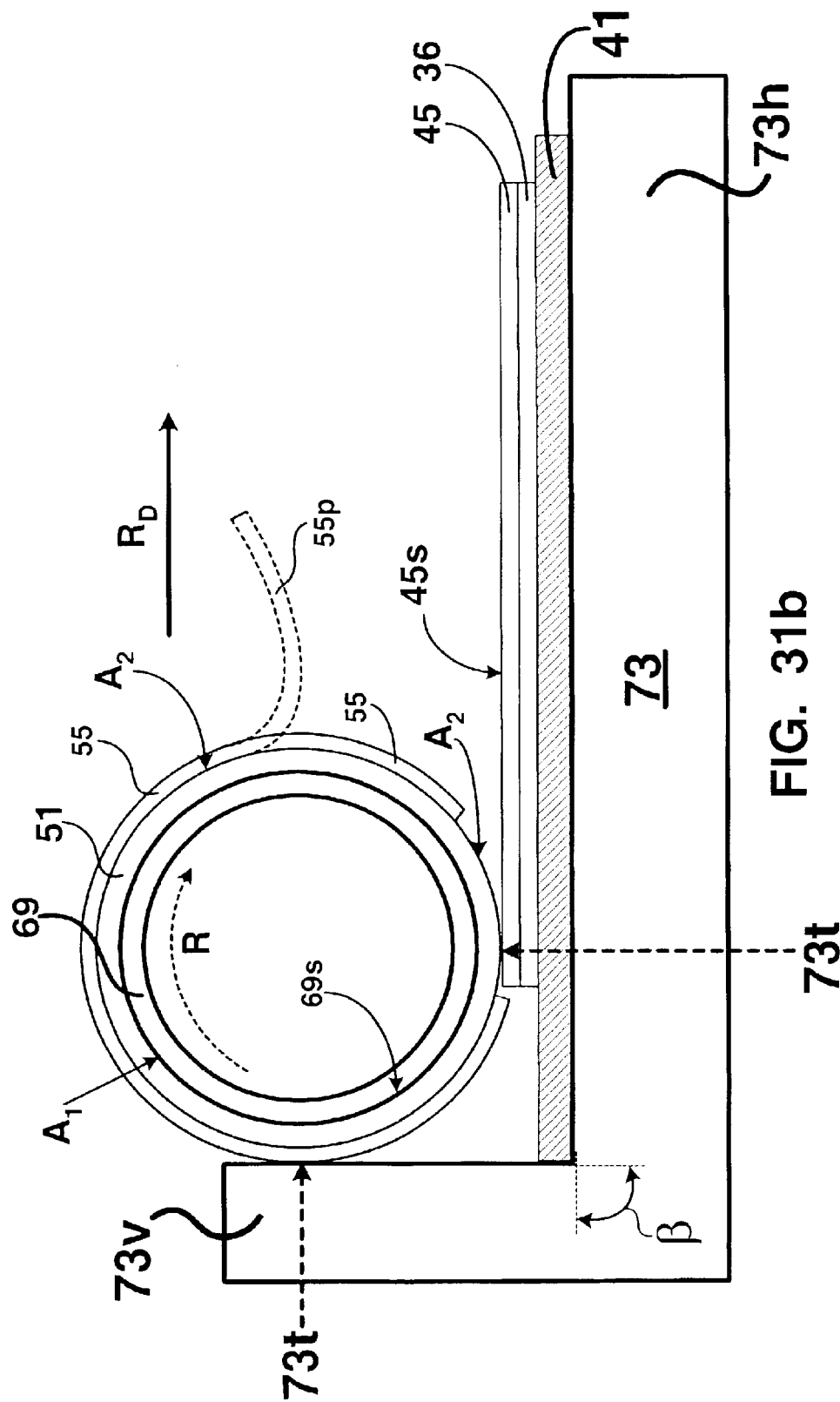
Figure 31C:
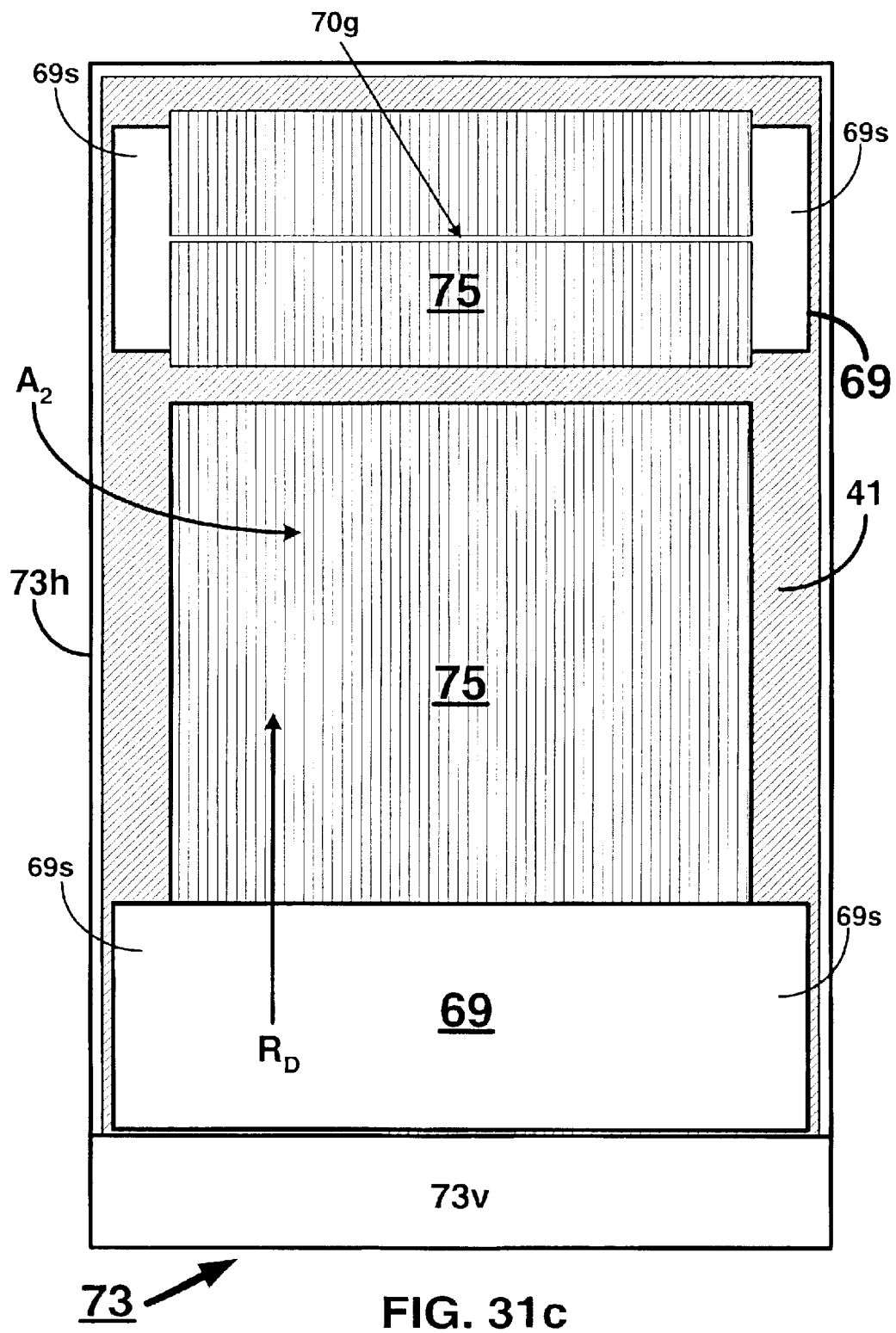

In FIGS. 31a, 31b, and 31c an L-shaped jig 73 that includes a horizontal section 73h and a vertical section 73v that forms a low vertical wall. The horizontal and vertical sections (73h, 73v) are at a right angle β to each other. The sections (73h, 73v) should be smooth and substantially flat. The L-shaped jig 73 can be used to effectuate a laminating of the compliant assembly 75 to a surface 69s of a cylinder 69.

In FIGS. 31a and 31b, the support substrate 41 can be placed on the horizontal section 73h and abutted against the vertical section 73v. Alternatively, if the compliant assembly 75 has already been separated from the support substrate 41, then a bed made from a smooth and flat piece of silicone rubber (not shown) can placed on the horizontal section 73h and an end of the bed is abutted against the vertical section 73v. The compliant assembly 75 is placed on top of the bed and is aligned with the vertical section 73v by using the vertical section 73v as a vertical straight edge. If the second backing 55 is still on the transfer adhesive layer 51, then the second backing 55 can be peeled off $P_2$ to expose the second adhesive surface $A_2$.

In FIGS. 31a and 31c, a cylinder 69 having an outer surface 69s is aligned with the horizontal section 73h and the vertical section 73v so that the outer surface 69s is tangent 73t to those sections (73h, 73v). The cylinder 69 is lowered onto the compliant assembly 75 so that the second adhesive surface $A_2$ is in contact with a portion of the outer surface 69s at the tangent point 73t. The cylinder 69 is then rolled R in a roll direction $R_D$ to collect the compliant assembly 75 on the outer surface 69s as the cylinder 69 is rolled R. After the compliant assembly 75 is rolled onto the cylinder 69, there may be a gap 70g between adjacent ends of the compliant assembly 75 as depicted in FIG. 31b.

Figure 32:
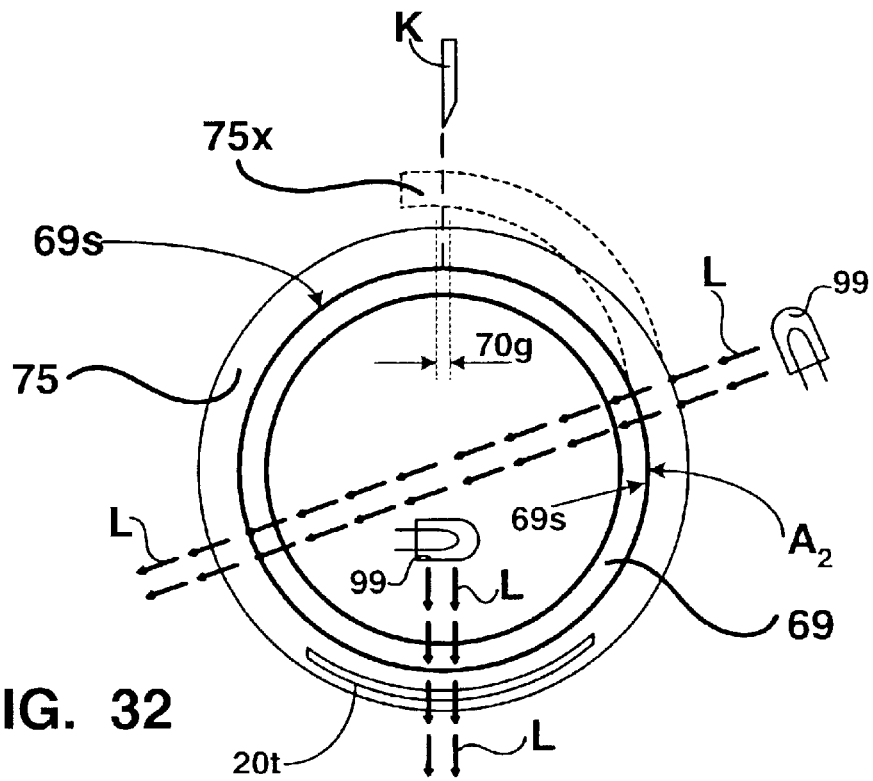

Suitable materials for the cylinder 69 include but are not limited to metal, ceramic, glass, quartz, and plastic. Preferably, the cylinder 69 is made from an optically transparent material so that light L can pass though the cylinder 69, the compliant media 70, and the imprint stamp 20t. Suitable optically transparent materials for the cylinder 69 include but are not limited to glass, quartz, and plastic. In FIG. 32, a light source 99, such as an ultraviolet light source, can be positioned inside or outside of the cylinder 69 to irradiate and cure a photopolymer material (not shown) that is urged into contact with the imprint stamp 20t. Because the compliant media 70 can be made to any size, the cylinder 69 can include an inside diameter that is sufficient to accommodate the light source 99. On the other hand, the light source 99 can be small enough to fit within an inside diameter of the cylinder 69.

In FIG. 31b, an alternative method for attaching the compliant media 45 to the cylinder 69 is depicted. The compliant media is denoted as 45 instead of 70 because the transfer adhesive layer 51 is not connected with the compliant media 45 in FIG. 31b. First, the first adhesive surface $A_1$ of the transfer adhesive layer 51 is exposed by peeling back the first backing 53 (not shown). Second, the outer surface 69s of the cylinder 69 is connected with the first adhesive surface $A_1$ and then the cylinder 69 is rolled to collect the transfer adhesive layer 51 on the outer surface 69s. Third, a portion of the second backing 55 is peeled back to expose a portion of the second adhesive surface $A_2$. Next, the exposed portion of the second adhesive surface $A_2$ is connected with the compliant media 45 at the tangent point 73t and the cylinder 69 is rolled in the roll direction $R_D$ to collect the compliant media 45 on the cylinder 69 while simultaneously peeling back 55p a remainder of the second backing 55 to expose the remainder of the second adhesive surface $A_2$.

Figure 33:
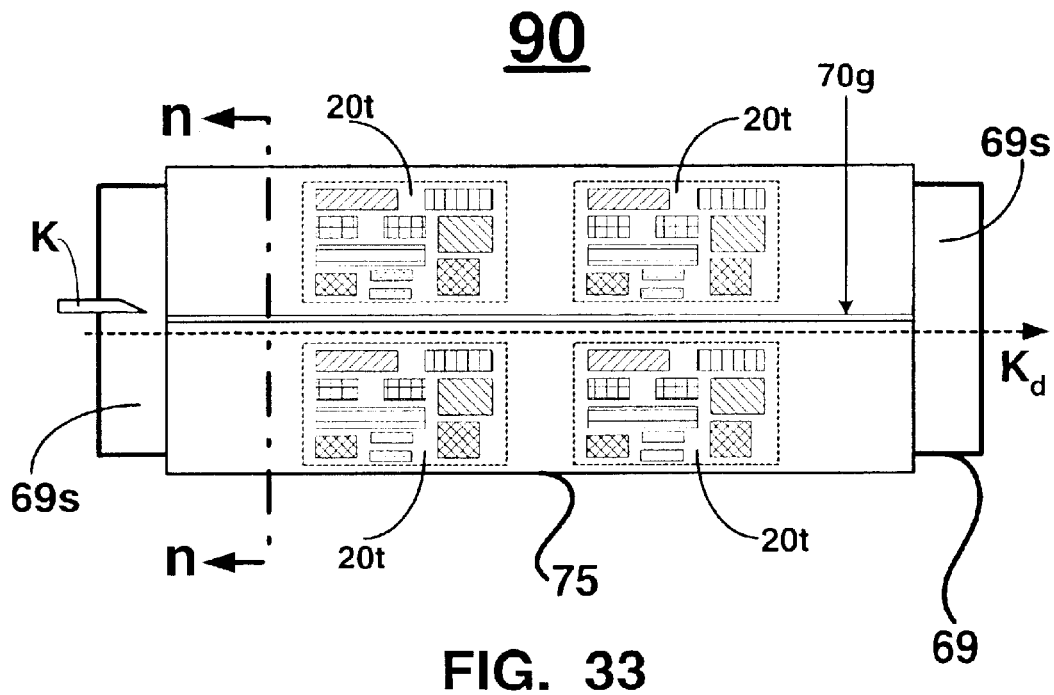

In FIGS. 32 and 33, after the compliant assembly 75 has been rolled onto the cylinder 69, there may be an excess portion 75x of the compliant assembly 75 that must be trimmed so that a majority of the compliant assembly 75 can be smoothly rolled onto the cylinder 69. As described above, there may be a gap 70g, if there is, then it is desirable to trim the excess portion 75x so that the gap 70g is as small as is practicable. A knife K or the like can be used to trim the excess 75x so that the compliant assembly 75 lays on the outer surface 69s without any bulges. In FIG. 33, the knife K can cut along a direction $K_d$ to effectuate the trimming of the excess 75x to form a completely laminated cylinder 90. In FIG. 33, the imprint stamps 20t are depicted in dashed outline because they are still positioned below the photopolymer shim 36 which have not been separated from the compliant media 70.

Figure 34A:
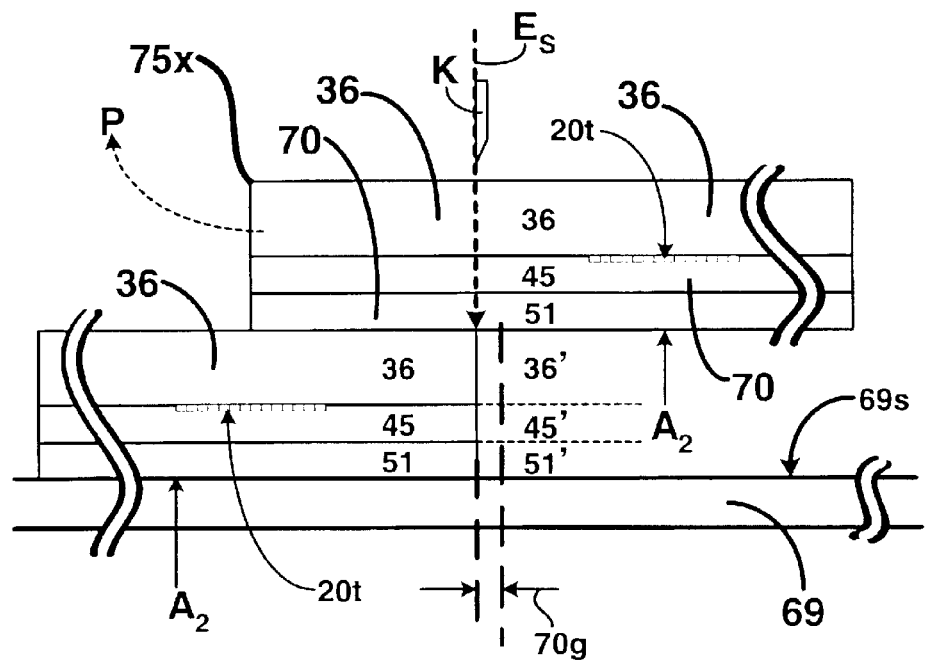
Figure 34B:
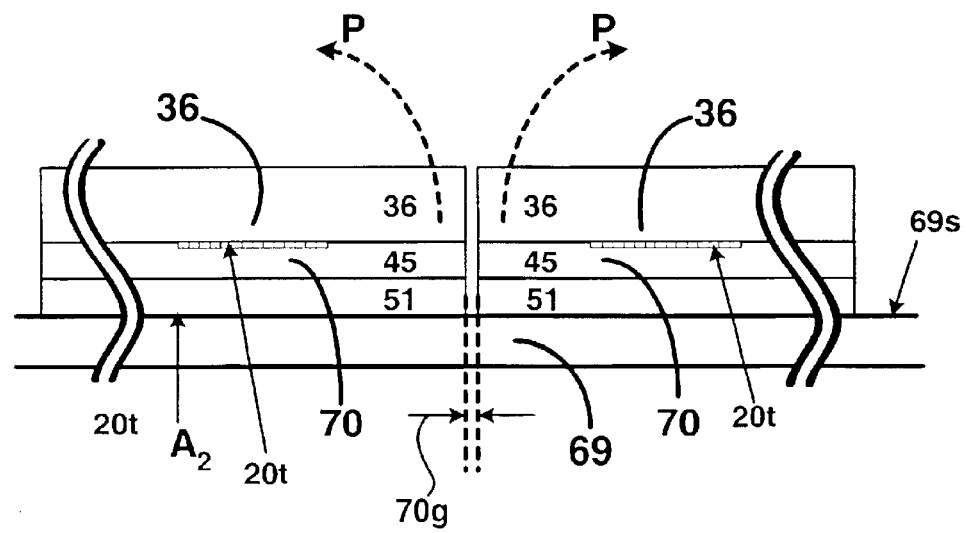

In FIG. 33, a line n—n thorough the cylinder 69 and the compliant assembly 75 is depicted in greater detail in a cross-sectional view in FIGS. 34a and 34b. In FIG. 34a, the compliant assembly 75 is depicted before the excess 75 x is trimmed. In FIG. 34b, the compliant assembly 75 is depicted after the excess 75x has been trimmed.

In FIG. 34a, the excess portion 75x comprises the compliant media 70 and the photopolymer shim 36. Because the thin plastic film 33 (see FIG. 28) that is connected with the photopolymer shim 36 may be opaque to light and the photopolymer shim 36 can be optically transparent, the photopolymer shim 36 can be peeled back as denoted by the dashed arrow P so that the compliant media 70 (i.e. the optically transparent adhesive 51 and optically transparent compliant media 45) can be used to sight along an edge $E_s$ of the compliant assembly 75 that is already connected with the outer surface 69s of the cylinder 69.

A knife cut K along the sight line (see dashed line) for the edge $E_s$ can be used to trim off the excess 75x so that the unconnected layers of the excess 75x will align with their respective connected layers, that is: 33' to 33; 36' to 36; 45' to 45; and 51' to 51, as depicted in FIG. 34a. After the trimming, there may be the small gap 70g between adjacent ends of the compliant assembly 75.

In FIG. 34b, but for the gap 70g, the compliant assembly 75 forms an almost continuous layer on the outer surface 69s of the cylinder 69. After the trimming, the photopolymer shim 36 can be peeled back P to expose the imprint stamp 20t on the compliant media 70.

Figure 35:
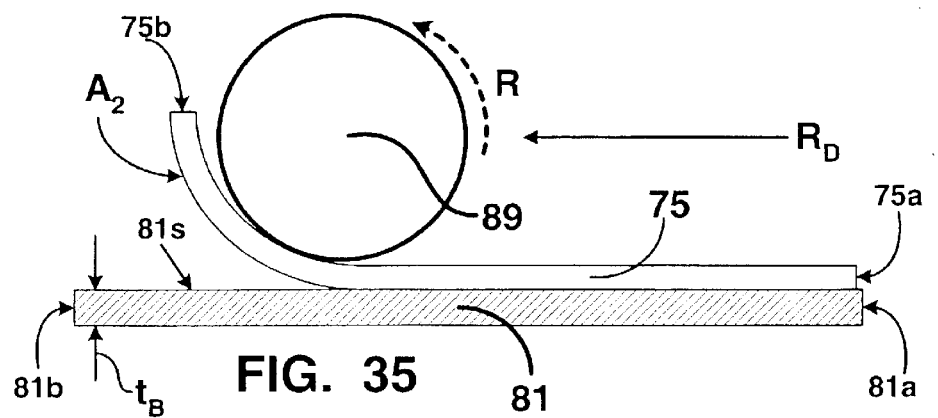
FIGS. 35 through 37b depict attaching a compliant assembly to a belt material according to the present invention.
Figure 36:
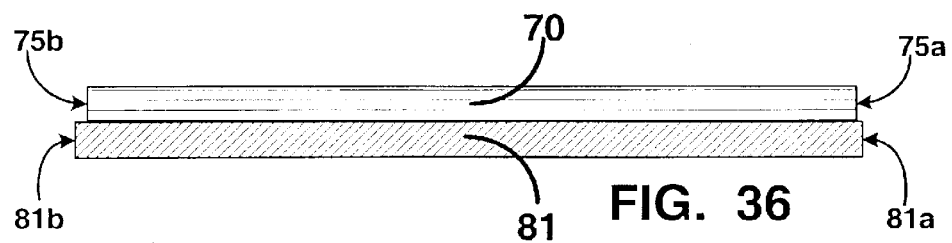

In FIGS. 35 and 36, the compliant assembly 75 is applied to a belt material 81. Prior to applying the compliant assembly 75 to the belt material 81, the second backing 55 is peeled off of the transfer adhesive layer 51 to expose the second adhesive surface $A_2$. Then the second adhesive surface $A_2$ is progressively applied to a surface 81s of the belt material 81. A roller 89, such as a rubber roller, can be used to roll R the compliant assembly 75 in a roll direction $R_D$.

Figure 37A:
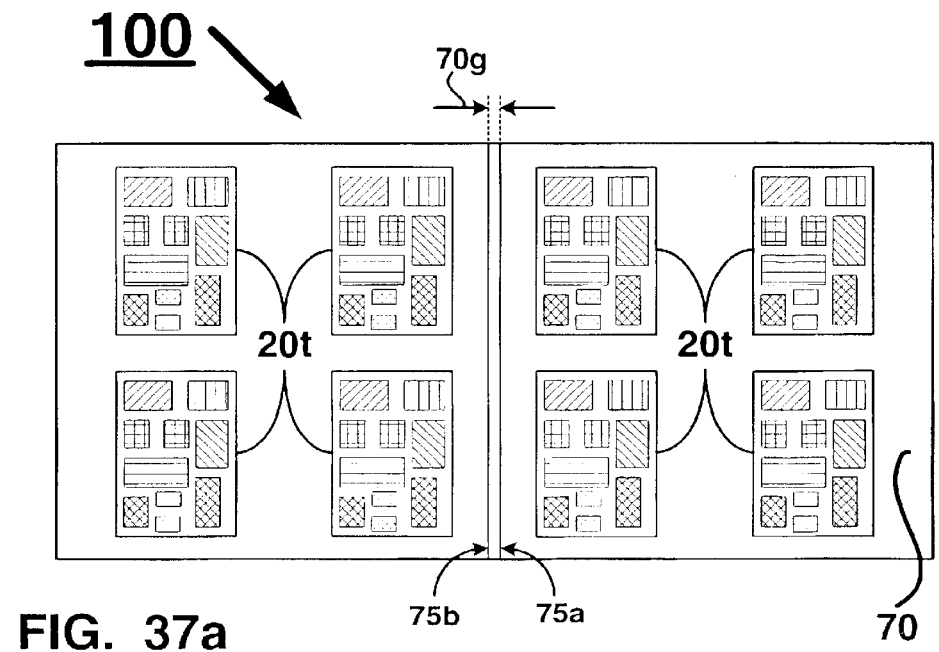
Figure 37B:
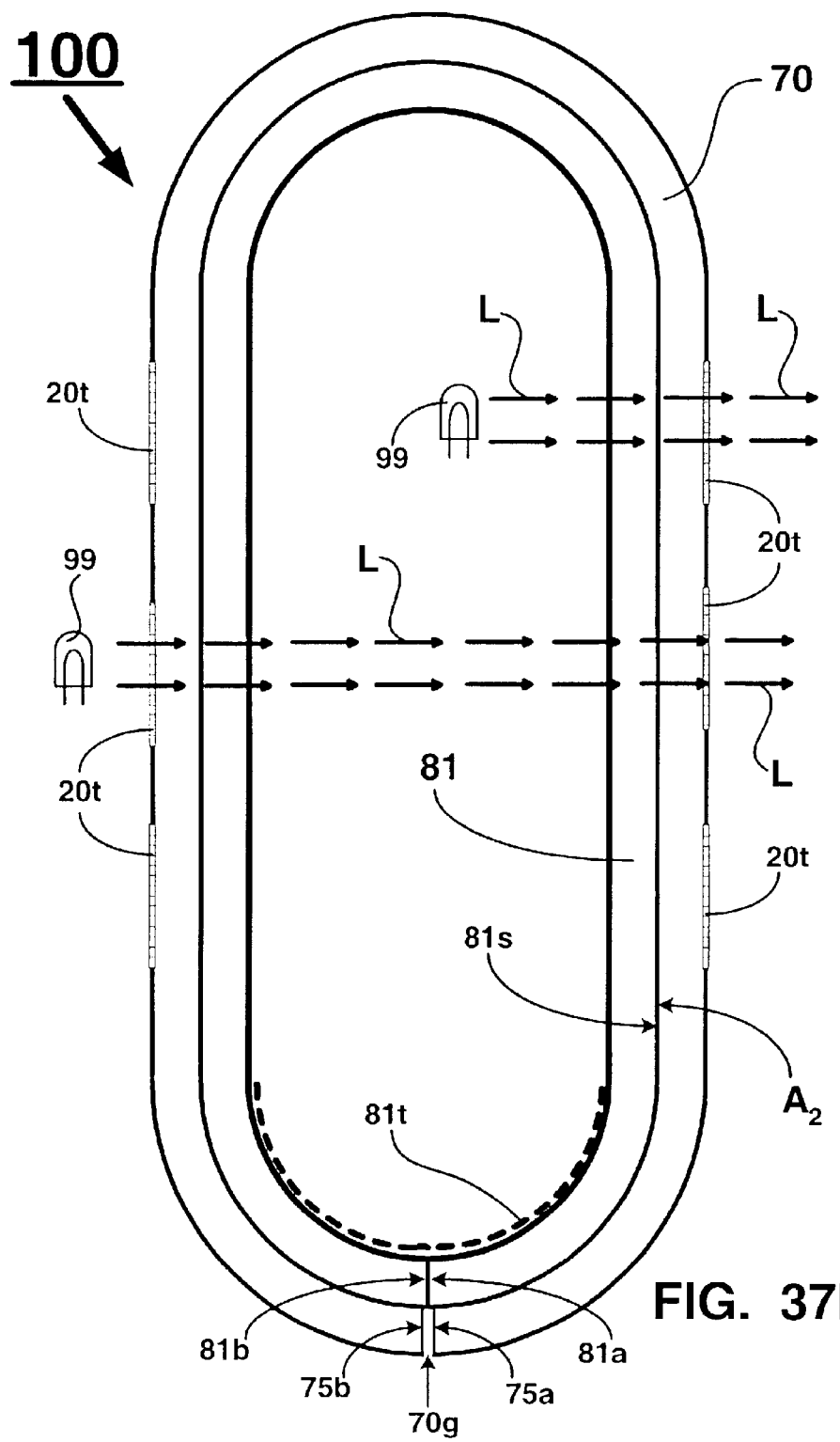

The rolling R can begin at a first end (75a, 81a) and end at a second end (75b, 81b) of the compliant assembly 75 and the belt material 81. After the compliant assembly 75 and the belt material 81 are connected with each other (see FIG. 36), then the first and second ends (81 a, 81b) can be joined to form a belt 100 as depicted in FIGS. 37a and 37b. As described above, a gap 70g may separate the first and second ends (75a, 75b). Splicing tape or the like may be used to cover the gap 70g. A piece of splicing tape 81t, or the like, can also be used to connect the first and second ends (81a, 81b) of the belt material 81 to form the belt 100. After the belt 100 is formed, the photopolymer shim 36 (i.e. the layer 33 and 36 of FIG. 28) can be peeled back P to expose the imprint stamp 20t on the compliant media 70. A suitable splicing tape includes but is not limited to a high temperature silicone based tape.

The belt material 81 can be an optically transparent material so that light L can pass though the belt material 81, the compliant media 70, and the imprint stamp 20t. A suitable optically transparent material for the belt material 81 includes but is not limited to a DuPont™ Mylar®. For example, a light source 99, such as an ultraviolet light source, can be positioned inside or outside of the belt 100 to irradiate and cure a photopolymer material (not shown) that is urged into contact with the imprint stamp 20t. The belt material 81 can have a thickness $t_B$ from about 50.0 μm to about 150.0 μm.

Although several embodiments of the present invention have been disclosed and illustrated, the invention is not limited to the specific forms or arrangements of parts so described and illustrated. The invention is only limited by the claims.

What is claimed is:

1. A method of replicating a high resolution three-dimensional imprint pattern on a compliant media, comprising:
   forming an imprint stamp on a master substrate by patterning and then etching the master substrate to define an imprint pattern in the substrate;
   depositing a release layer over the imprint pattern, the release layer including a first thickness operative to conformally coat the imprint pattern;
   depositing a silicone-based elastomer layer over the release layer to a first depth operative to completely cover the imprint pattern;
   curing the silicone-based elastomer layer by heating the master substrate;
   releasing the silicone-based elastomer layer from the release layer;
   separating the imprint stamp from an excess portion of the silicone-based elastomer layer that surrounds the imprint stamp;
   repeating the above steps, as necessary, to form additional imprint stamps from the master substrate;
   placing a flat and thin plastic film having a third thickness on a flat and compliant silicone rubber backing having a fourth thickness;
   coating a surface of the thin plastic film with a photopolymer solution;
   spreading the photopolymer solution over the surface of the plastic film to form a photopolymer layer having a fifth thickness;
   placing a patterned surface of the imprint stamp on the photopolymer layer;
   curing the photopolymer layer to fix a position of the imprint stamp on the photopolymer layer and to transfer an image of the imprint pattern on the patterned surface of the imprint stamp to the photopolymer layer by irradiating the photopolymer layer with an ultraviolet light of a predetermined intensity for a first time period;
   separating the imprint stamp from the photopolymer layer so that the image of the imprint pattern defines a photopolymer shim;
   post-curing the photopolymer shim by heating the photopolymer shim;
   depositing a coating of a fluorocarbon material having a sixth thickness on the photopolymer shim;
   separating the thin plastic film from the silicone rubber backing;
   attaching the photopolymer shim to a support substrate;
   attaching a shim stock having a first height to the support substrate, the shim stock is positioned adjacent to the photopolymer shim and is spaced apart from the photopolymer shim by a first distance;
   coating the photopolymer shim and the shim stock with a compliant material selected from the group consisting of a silicone-based elastomer material and an amorphous fluoropolymer material;
   spreading the compliant material over the photopolymer shim and the shim stock to form a compliant media that covers the photopolymer shim and the shim stock and to transfer the imprint pattern in the photopolymer shim to the compliant media;
   heating the support substrate;
   cooling the support substrate;
   separating the shim stock from the compliant media;
   applying a first adhesive surface of a transfer adhesive layer to a surface of the compliant media so that the transfer adhesive layer adheres to the compliant media, the transfer adhesive layer includes a seventh thickness and a second adhesive surface; and
   separating the compliant media from a selected one of the support substrate or the photopolymer shim by peeling back the transfer adhesive layer.

2. The method as set forth in claim 1, wherein the master substrate is a material selected from the group consisting of a silicon substrate and a silicone wafer.

3. The method as set forth in claim 1, wherein the release layer comprises a fluorocarbon material.

4. The method as set forth in claim 1, wherein the first thickness of the release layer is from about 50.0 nanometers to about 150.0 nanometers.

5. The method as set forth in claim 1, wherein the silicone-based elastomer layer is a Polydimethyl Siloxane material.

6. The method as set forth in claim 1, wherein the first depth of the silicone-based elastomer layer is from about 0.5 millimeters to about 1.5 millimeters.

7. The method as set forth in claim 1, wherein curing the silicone-based elastomer layer comprises heating the master substrate for about 4.0 hours at about 100.0 degrees centigrade.

8. The method as set forth in claim 1, wherein the step of separating the silicone-based elastomer layer from the release layer comprises lifting off the silicone-based elastomer layer from the release layer by grabbing an edge portion of the silicone-based elastomer layer and peeling off the silicone-based elastomer layer from the release layer.

9. The method as set forth in claim 1, wherein the step of separating the imprint stamp further comprises:
   placing the silicone-based elastomer layer on a substantially flat substrate;
   cutting around a perimeter of the imprint stamp to release the excess portions of the silicone-based elastomer layer from the imprint stamp; and
   peeling off the excess portions of the silicone-based elastomer layer from the substrate so that the imprint stamp is not connected with the excess portions of the silicone-based elastomer layer.

10. The method as set forth in claim 9, wherein the substantially flat substrate is a material selected from the group consisting of a glass, a metal, a plastic, and quartz.

11. The method as set forth in claim 1, wherein the thin plastic film is a material selected from the group consisting of a Polymide and a Polyester.

12. The method as set forth in claim 1, wherein the third thickness of the thin plastic film is from about 40.0 micrometers to about 100.0 micrometers.

13. The method as set forth in claim 1, wherein the fourth thickness of the silicone rubber backing is from about 0.125 inches to about 0.25 inches.

14. The method as set forth in claim 1, wherein the spreading of the photopolymer solution comprises sliding a Mayer bar including a wire of a first diameter across the surface of the plastic film.

15. The method as set forth in claim 14, wherein the first diameter of the wire on the Mayer bar is from about 50.0 micrometers to about 100.0 micrometers.

16. The method as set forth in claim 1, wherein the photopolymer solution comprises a mixture of about 50% of a photopolymer material and about 50% acetone.

17. The method as set forth in claim 1, wherein the fifth thickness of the photopolymer layer is from about 5.0 micrometers to about 10.0 micrometers.

18. The method as set forth in claim 1, wherein the placing the imprint stamp on the photopolymer layer further comprises:
placing an edge portion of the imprint stamp in contact with the photopolymer layer and holding the edge portion down; and
progressively lowering a remainder of the patterned surface into contact with the photopolymer layer.

19. The method as set forth in claim 18 and further comprising:
floating the imprint stamp on a surface of the photopolymer layer to position the imprint stamp at a predetermined location on the photopolymer layer.

20. The method as set forth in claim 1, wherein the placing the imprint stamp on the photopolymer layer further comprises:
floating the imprint stamp on the photopolymer layer to position the imprint stamp at a predetermined location on the photopolymer layer.

21. The method as set forth in claim 1, wherein the ultraviolet light for the curing of the photopolymer layer comprises a wavelength from about 300.0 nanometers to about 400.0 nanometers.

22. The method as set forth in claim 1, wherein the ultraviolet light is generated by a UVA ultraviolet light source.

23. The method as set forth in claim 1, wherein the predetermined intensity of the ultraviolet light is about 150 milliwatts per centimeter squared.

24. The method as set forth in claim 1, wherein the first time period for the curing of the photopolymer layer is from about 5.0 seconds to about 60.0 seconds.

25. The method as set forth in claim 1, wherein the post-curing of the photopolymer shim comprises heating the photopolymer shim for about 1.0 hour at about 100.0 degrees centigrade.

26. The method as set forth in claim 1 and further comprising rinsing the photopolymer shim with acetone after the post-curing step.

27. The method as set forth in claim 1, wherein the attaching the photopolymer shim to the support substrate comprises laying the photopolymer shim on the support substrate and fastening an end of the photopolymer shim to the support substrate using a high temperature adhesive tape.

28. The method as set forth in claim 1, wherein the support substrate for the photopolymer shim is a material selected from the group consisting of a glass, and quartz.

29. The method as set forth in claim 1, wherein the shim stock is attached to the support substrate using a high temperature adhesive tape.

30. The method as set forth in claim 1, wherein the first height of the shim stock is from about 0.5 millimeters to about 1.5 millimeters.

31. The method as set forth in claim 1, wherein the first distance between the shim stock and the photopolymer shim is from about 1.0 millimeters to about 3.0 millimeters.

32. The method as set forth in claim 1, wherein the silicone-based elastomer material for coating the photopolymer shim and the shim stock is a Polydimethyl Siloxane material.

33. The method as set forth in claim 1, wherein the support substrate is pre-heated to a temperature of about 100 degrees centigrade.

34. The method as set forth in claim 1, wherein the heating the support substrate comprises heating the support substrate for about 1.0 hour at about 100.0 degrees centigrade.

35. The method as set forth in claim 1, wherein the second diameter of the wire on the Mayer bar is from about 1.0 millimeters to about 2.0 millimeters.

36. The method as set forth in claim 1, wherein the cooling of the support substrate comprises allowing the support substrate to cool down to about a room temperature.

37. The method as set forth in claim 1, wherein the separating the shim stock comprises cutting the compliant media along an edge of the shim stock that is adjacent to the photopolymer shim.

38. The method as set forth in claim 1, wherein the sixth thickness of the fluorocarbon material is from about 50.0 nanometers to about 150.0 nanometers.

39. The method as set forth in claim 1, wherein the seventh thickness of the transfer adhesive layer is from about 20.0 micrometers to about 100.0 micrometers.

40. The method as set forth in claim 1, wherein the transfer adhesive layer is an optically transparent material.

41. The method as set forth in claim 40, wherein the optically transparent material is an optically clear silicone adhesive.

42. The method as set forth in claim 1 and further comprising laminating the compliant media to a belt material by applying the second adhesive surface of the transfer adhesive layer to a surface of the belt material.

43. The method as set forth in claim 42, wherein the belt material is an optically transparent material.

44. The method as set forth in claim 43, wherein the optically transparent material is a Polyester film.

45. The method as set forth in claim 1 and further comprising laminating the compliant media to a cylinder by applying the second adhesive surface of the transfer adhesive layer to an outer surface of the cylinder.

46. The method as set forth in claim 45, wherein the cylinder is made from an optically transparent material selected from the group consisting of a glass, quartz, and a plastic.

47. The method as set forth in claim 1 and further comprising:
preheating the support substrate prior to the coating of the photopolymer shim and the shim stock with the compliant material to prepare the support substrate for the coating with the silicone-based elastomer material.

* * * * *